United States Patent
Song et al.

(10) Patent No.: US 9,330,931 B2
(45) Date of Patent: May 3, 2016

(54) METHOD OF MANUFACTURING SEMICONDUCTOR DEVICE

(71) Applicant: Samsung Electronics Co., Ltd., Suwon-si (KR)

(72) Inventors: Min-sung Song, Hwaseong-si (KR); Jin-hyun Shin, Suwon-si (KR); Jae-hwang Sim, Hwaseong-si (KR); Joon-sung Lim, Yongin-si (KR); Bong-hyun Choi, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/568,764

(22) Filed: Dec. 12, 2014

(65) Prior Publication Data

US 2015/0348795 A1   Dec. 3, 2015

(30) Foreign Application Priority Data

May 27, 2014  (KR) ........................ 10-2014-0063824

(51) Int. Cl.
*H01L 21/308* (2006.01)
*H01L 21/768* (2006.01)
*H01L 21/033* (2006.01)

(52) U.S. Cl.
CPC ........ *H01L 21/3086* (2013.01); *H01L 21/3081* (2013.01); *H01L 21/3088* (2013.01); *H01L 21/768* (2013.01); *H01L 21/0334* (2013.01); *H01L 21/0337* (2013.01); *H01L 21/0338* (2013.01)

(58) Field of Classification Search
CPC ............ H01L 21/3081; H01L 21/3086; H01L 21/768; H01L 21/0334; H01L 21/0337; H01L 21/0338
See application file for complete search history.

(56) References Cited

U.S. PATENT DOCUMENTS

| | | | |
|---|---|---|---|
| 8,183,152 B2 | 5/2012 | Sim et al. |
| 8,338,079 B2 | 12/2012 | Bae et al. |
| 8,338,083 B2 | 12/2012 | Bae et al. |
| 8,339,571 B2 | 12/2012 | Sewell et al. |
| 8,394,571 B2 | 3/2013 | Bae et al. |
| 8,431,329 B2 | 4/2013 | Bae et al. |
| 8,465,901 B2 | 6/2013 | Bae et al. |
| 8,492,068 B2 | 7/2013 | Bae et al. |
| 8,492,075 B2 | 7/2013 | Bae et al. |
| 8,507,185 B2 | 8/2013 | Bae et al. |

(Continued)

FOREIGN PATENT DOCUMENTS

| | | |
|---|---|---|
| JP | 2011249585 | 12/2011 |
| JP | 2012514762 | 6/2012 |

(Continued)

*Primary Examiner* — Ha Tran T Nguyen
*Assistant Examiner* — Aaron Dehne
(74) *Attorney, Agent, or Firm* — Onello & Mello, LLP

(57) ABSTRACT

In a method of manufacturing a semiconductor device, which uses a triple patterning process, a porous layer covering sidewalls and an upper surface of a polymer-containing pattern is formed on a layer to be etched. A decomposition gas is supplied to the polymer-containing pattern through the porous layer, and a portion of the polymer-containing pattern is decomposed to form a reduced polymer-containing pattern and form a void between the reduced polymer-containing pattern and the porous layer. A portion of the porous layer is removed to form a porous spacer pattern spaced apart from the reduced polymer-containing pattern. The layer to be etched is etched by using the reduced polymer-containing pattern and the porous spacer pattern as an etch mask.

20 Claims, 37 Drawing Sheets

(56) References Cited

U.S. PATENT DOCUMENTS

| | | |
|---|---|---|
| 8,541,316 B2 | 9/2013 | Sukekawa |
| 8,557,675 B2 | 10/2013 | Licausi |
| 8,562,843 B2 | 10/2013 | Liu et al. |
| 8,598,632 B2 | 12/2013 | Tran et al. |
| 8,840,796 B2 | 9/2014 | Liu et al. |
| 2008/0038934 A1* | 2/2008 | Vrtis ................ H01L 21/02115 438/759 |
| 2009/0153826 A1 | 6/2009 | Sewell et al. |
| 2010/0170868 A1 | 7/2010 | Lin et al. |
| 2010/0330498 A1 | 12/2010 | Bae et al. |
| 2011/0250757 A1* | 10/2011 | Sukekawa ........... H01L 21/0337 438/703 |
| 2011/0294297 A1* | 12/2011 | Sukekawa ........... H01L 21/0337 438/703 |
| 2013/0069246 A1 | 3/2013 | Bae et al. |
| 2013/0095662 A1 | 4/2013 | Liu et al. |
| 2014/0024218 A1 | 1/2014 | Liu et al. |
| 2014/0306351 A1* | 10/2014 | Kim ................. H01L 21/76855 257/774 |

FOREIGN PATENT DOCUMENTS

| | | |
|---|---|---|
| JP | 5225822 | 7/2013 |
| KR | 2008034568 | 4/2008 |
| KR | 100909758 | 7/2009 |
| KR | 2011002796 | 1/2011 |
| KR | 101326945 | 11/2013 |
| WO | 2010080789 | 7/2010 |

* cited by examiner

METHOD OF MANUFACTURING SEMICONDUCTOR DEVICE

CROSS-REFERENCE TO RELATED APPLICATIONS

This application claims the benefit of Korean Patent Application No. 10-2014-0063824, filed on May 27, 2014, in the Korean Intellectual Property Office, the disclosure of which is incorporated herein in its entirety by reference.

BACKGROUND

The inventive concepts relate to a method of manufacturing a semiconductor device, and more particularly, to a method of manufacturing a semiconductor device, the method including a process of forming patterns having a fine pitch exceeding the limit of the resolution of conventional exposure equipment by using a triple patterning process.

A pattern miniaturization is necessarily required to manufacture a high integrated semiconductor device. The sizes of individual devices have to be small, if possible, to integrate many devices into a small area, and to this end, a pitch, which is the sum of the width of patterns to be formed and an interval between the patterns, has to be small. As design rules of semiconductor devices are rapidly reduced, there is a limit in forming patterns having fine pitches due to the limit of the resolution of a photolithography process for forming patterns that are required for implementing the semiconductor devices. In addition, in the case of manufacturing highly scaled high density semiconductor devices, a technique that can simultaneously form patterns having various widths while reducing the number of uses of a photolithography process is needed to simultaneously form fine patterns having a fine width exceeding the limit of the resolution of the photolithography process and relatively large patterns that can be implemented by the photolithography process.

SUMMARY

The inventive concepts provide a method of manufacturing a semiconductor device, by which patterns having a fine pitch exceeding the limit of the resolution of a photolithography process may be readily implemented.

The inventive concepts also provide a method of manufacturing a semiconductor device, in which the addition of a photolithography process due to a difference in pattern width is not needed when simultaneously forming patterns having various widths in a plurality of areas and performing different functions.

According to an aspect of the inventive concepts, there is provided a method of manufacturing a semiconductor device, the method including: forming a polymer-containing pattern on a layer to be etched; forming a porous layer covering sidewalls and an upper surface of the polymer-containing pattern; supplying a decomposition gas to the polymer-containing pattern through the porous layer and decomposing a portion of the polymer-containing pattern to form a reduced polymer-containing pattern and form a void between the reduced polymer-containing pattern and the porous layer; removing a portion of the porous layer to form a porous spacer pattern spaced apart from the reduced polymer-containing pattern; and etching the layer to be etched by using the reduced polymer-containing pattern and the porous spacer pattern as an etch mask.

In some embodiments, in the forming of the porous layer, the porous layer may be formed to conformally cover an exposed surface of the layer to be etched and exposed surfaces of the polymer-containing pattern.

In some embodiments, in the forming of the reduced polymer-containing pattern and the void, a portion of the polymer-containing pattern may be decomposed from the sidewalls thereof by the decomposition gas to reduce a width of the polymer-containing pattern, and the void may be formed to have a ring shape around the reduced polymer-containing pattern in a space surrounded by the porous layer.

In some embodiments, in the forming of the reduced polymer-containing pattern and the void, a portion of the polymer-containing pattern may be decomposed from the sidewalls and the upper surface thereof by the decomposition gas to reduce a width and a height of the polymer-containing pattern, and the void may be formed to have an inverted-U shaped-cross section around the reduced polymer-containing pattern in a space surrounded by the porous layer.

In some embodiments, the porous spacer pattern may include a pair of tripling portions spaced apart from two sidewalls of the reduced polymer-containing pattern and while facing two sidewalls thereof, respectively.

In some embodiments, the forming the polymer-containing pattern may include: forming a polymer-containing layer on the layer to be etched; forming a capping layer on the polymer-containing layer; and patterning the capping layer and the polymer-containing layer to thereby form the polymer-containing pattern and a capping pattern covering the upper surface of the polymer-containing pattern, wherein the capping pattern is interposed between the polymer-containing pattern and the porous layer after the porous layer is formed.

In some embodiments, the layer to be etched may include a substrate, wherein the etching the layer to be etched includes defining an active area in the substrate by forming an isolation trench in the substrate.

In some embodiments, the defining the active area may include etching the substrate to form the isolation trench including a plurality of line trench portions, the plurality of line trench portions extending parallel to one another in a first direction and spaced apart from one another, wherein a length of every third line trench portion according to an arrangement order from among the plurality of line trench portions is shorter than a length of the other line trench portions.

In some embodiments, the defining the active area may include etching the substrate to form the isolation trench including a plurality of line trench portions, the plurality of line trench portions extending parallel to one another in a first direction and spaced apart from one another, wherein a level of an end point of a first end portion of every third line trench portion according to an arrangement order of the plurality of line trench portions is different from a level of an end point of a second end portion of each of the other line trench portions, the first and second end portions being directed in the same direction.

In some embodiments, the defining the active area may include defining a plurality of line active areas extending parallel to one another and being spaced apart from one another, and defining a bridge active area extending in the second direction different from the first direction so that at least some of the plurality of line active areas are connected to each other at end portions thereof.

In some embodiments, method may further include: forming a plurality of word lines extending to intersect the plurality of line active areas on the plurality of line active areas; and forming a common source line extending in the second direction on the bridge active area to overlap the bridge active area.

According to another aspect of the inventive concepts, there is provided a method of manufacturing a semiconductor device, the method including: forming a feature layer on a substrate having a first area and a second area; forming a stack structure, in which a polymer-containing pattern and a capping pattern which have different widths in the first area and the second area are stacked, on the feature layer; forming a porous layer covering the stack structure in the first area and the second area; supplying a decomposition gas to the polymer-containing pattern through the porous layer and decomposing portions of the polymer-containing pattern to form reduced polymer-containing patterns and voids between the reduced polymer-containing patterns and the porous layer; removing portions of the porous layer in the first area and the second area to form a porous spacer pattern spaced apart from the reduced polymer-containing pattern; removing portions of the capping pattern so that the voids in the first area are opened and the voids in the second area are closed down by a remaining portion of the capping pattern; and etching the feature layer by using the reduced polymer-containing patterns and the porous spacer pattern as an etch mask in the first area and etching the feature layer by using the remaining portion of the capping pattern and the porous spacer pattern as an etch mask in the second area, to form a feature pattern having different widths in the first area and the second area.

In some embodiments, the method may further include etching the substrate by using the feature pattern as an etch mask to define active areas having different widths in the first area and the second area.

In some embodiments, the forming the stack structure of the polymer-containing pattern and the capping pattern may include: sequentially forming a polymer-containing layer and a capping layer on the feature layer; patterning the capping layer to form a first capping pattern, which is positioned in the first area and has a first width, and a second capping pattern which is positioned in the second area and has a second width that is larger than the first width; and etching the polymer-containing layer in the first area and the second area by using the first capping pattern and the second capping pattern as an etch mask to form a first polymer-containing pattern having a third width in the first area and a second polymer-containing pattern having a fourth width, which is larger than the third width, in the second area.

In some embodiments, the polymer-containing layer may be etched under the condition that the consumption of the first capping pattern is greater than that of the second capping pattern due to a width difference between the first capping pattern and the second capping pattern during the etching the polymer-containing layer, and a thickness of the first capping pattern may be smaller than that of the second capping pattern after the first polymer-containing pattern and the second polymer-containing pattern are formed.

In some embodiments, in the removing of the portion of the capping pattern, the amount of etching of the capping pattern may be adjusted so that the second capping pattern remains on the second polymer-containing pattern so as not to open the voids in the second area and the first capping pattern does not remain on the first polymer-containing pattern in the first area.

In some embodiments, the first area may include a memory cell area, and the second area may include a peripheral circuit area or a core area.

According to still another aspect of the inventive concepts, there is provided a method of manufacturing a semiconductor device, the method including: forming a feature layer on a substrate; forming a stack structure, in which a polymer-containing pattern and a capping pattern are stacked, on the feature layer; forming a porous layer covering the stack structure; decomposing a portion of the polymer-containing pattern by using a decomposition gas passing through the porous layer to form a reduced polymer-containing pattern and a void between the reduced polymer-containing pattern and the porous layer; removing a portion of the porous layer and the capping pattern so that a porous spacer pattern remains in a position spaced apart from the reduced polymer-containing pattern; and etching the feature layer by using the reduced polymer-containing pattern and the porous spacer pattern as an etch mask.

In some embodiments, the polymer-containing pattern may include an organic compound having a carbon content of about 85 wt % to about 99 wt %, the capping pattern may include a silicon oxynitride layer, the porous layer may include a silicon oxide layer, and the decomposition gas may include an oxygen gas.

In some embodiments, in the forming of the reduced polymer-containing pattern and the void, a decomposition speed from a sidewall of the polymer-containing pattern due to the decomposition gas may be higher than that from an upper surface of the polymer-containing pattern due to the decomposition gas.

According to still another aspect of the inventive concepts, there is provided a method of manufacturing a semiconductor device, the method including forming a feature layer on a substrate having a first area and a second area. A first etch mask pattern having a first width is formed in the first area on the feature layer, and a second etch mask pattern having a second width is formed in the second area on the feature layer. The feature layer is patterned by using the first etch mask pattern and the second etch mask pattern to thereby form a first feature pattern having a third width, which is smaller than the first width, in the first area and a second feature pattern having a fourth width, which is larger than the second width, in the second area.

BRIEF DESCRIPTION OF THE DRAWINGS

Exemplary embodiments of the inventive concepts will be more clearly understood from the following detailed description taken in conjunction with the accompanying drawings in which.

DETAILED DESCRIPTION

Figure 1A:
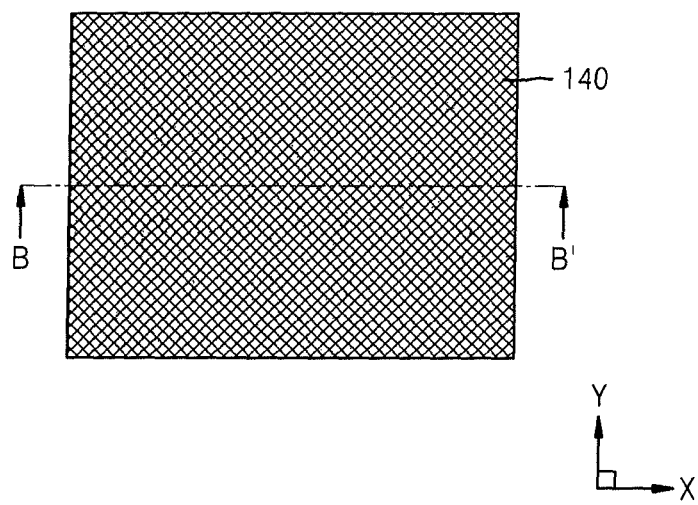
FIGS. 1A to 8B illustrate views of a method of manufacturing a semiconductor device according to exemplary embodiments.

The inventive concepts will now be described more fully with reference to the accompanying drawings, in which exemplary embodiments of the inventive concepts are shown. In the drawings, the same elements are denoted by the same reference numerals and a repeated explanation thereof will not be given.

Hereinafter, the inventive concepts will be described more fully with reference to the accompanying drawings, in which exemplary embodiments of the inventive concepts are shown. The inventive concepts may, however, be embodied in many different forms and should not be construed as being limited to the embodiments set forth herein; rather these embodiments are provided so that this disclosure will be thorough and complete, and will fully convey the concept of the inventive concepts to one of ordinary skill in the art.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of exemplary embodiments. For example, a first element may be referred to as a second element, and likewise, a second element may be referred to as a first element without departing from the scope of the inventive concepts.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

It should also be noted that in some alternative implementations, operations may be performed out of the sequences depicted in the flowcharts. For example, two operations shown in the drawings to be performed in succession may in fact be executed substantially concurrently or even in reverse of the order shown, depending upon the functionality/acts involved.

Modifications of shapes illustrated in the accompanying drawings may be estimated according to manufacturing processes and/or process variation. Accordingly, embodiments of the inventive concepts should not be construed as being limited to a specific shape of an area illustrated in the present specification and should include a change in shape which may be caused in manufacturing processes. As used herein, the term "and/or" includes any and all combinations of one or more of the associated listed items.

FIGS. 1A to 8B are views for explaining a method of manufacturing a semiconductor device, according to exemplary embodiments. FIGS. 1A, 2A, . . . , and 8A are plan views illustrating intermediate process steps in the method of manufacturing a semiconductor device. FIGS. 1B, 2B, . . . , and 8B are cross-sectional views taken along lines B-B' of FIGS. 1A, 2A, . . . , and 8A, respectively.

Figure 1B:
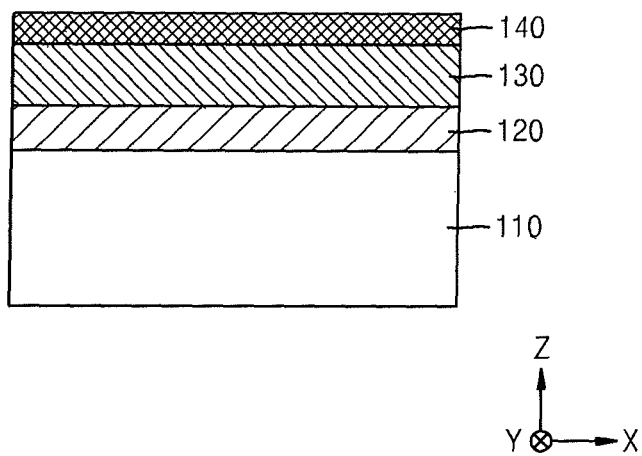

Referring to FIGS. 1A and 1B, a feature layer 120 that is a layer to be etched, a polymer-containing layer 130, and a capping layer 140 are sequentially formed on a substrate 110.

In some embodiments, the substrate 110 may include a semiconductor, such as Si or Ge, or a compound semiconductor, such as SiGe, SiC, GaAs, InAs, or InP. In some other embodiments, the substrate 110 may have a silicon on insulator (SOI) structure. The substrate 110 may be a substrate including a conductive area, for example, a well doped with impurities or a structure doped with impurities.

The feature layer 120 may be a conductive layer, a dielectric layer, an insulating layer, or a combination thereof. In some embodiments, the feature layer 120 may include a layer formed of metal, alloy, metal carbide, metal nitride, metal oxynitride, metal oxycarbide, semiconductor, polysilicon, oxide, nitride, oxynitride, or a combination thereof. However, the inventive concepts are not limited thereto. In some other embodiments, the feature layer 120 may form a hard mask layer. In this case, the feature layer 120 may include any of various layers according to the type of the substrate 110. For example, the feature layer 120 may include an oxide layer, a nitride layer, a SiCN layer, a polysilicon layer, or a combination thereof.

The polymer-containing layer 130 may include an amorphous carbon layer (ACL) or a carbon-containing layer formed of a spin-on hardmask (SOH) material. The carbon-containing layer formed of the SOH material may be formed of an organic compound having a relatively high carbon content of about 85 wt % to about 99 wt % of the total weight of the organic compound. The organic compound may be formed of a hydrocarbon compound including an aromatic ring, for example, phenyl, benzene, or naphthalene, or a derivative thereof.

A spin coating or chemical vapor deposition (CVD) process may be used to form the polymer-containing layer 130. For example, a process of forming the polymer-containing layer 130 such as a carbon-containing layer is as follows. First, an organic compound layer having a thickness of about 1000 Å to about 5000 Å is formed on the feature layer 120. In this case, a spin coating process or another deposition process may be used according to the need. The organic compound may be formed of a hydrocarbon compound including an aromatic ring, for example, phenyl, benzene, or naphthalene, or a derivative thereof. The organic compound may be formed of a material having a relatively high carbon content of about 85 wt % to about 99 wt % of the total weight of the organic compound. A carbon-containing layer may be formed by primarily baking the organic compound under a temperature of about 150° C. to about 350° C. The primary bake may be performed for about 60 seconds. Next, the carbon-containing layer is secondarily baked under a temperature of about 300° C. to about 550° C. to harden the carbon-containing layer. The secondary bake may be performed for about 30 seconds to about 300 seconds. In this manner, by hardening the carbon-containing layer through the secondary bake, the carbon-containing layer is not damaged although a deposition process is performed under a relatively high temperature of about 400° C. or more when forming another layer on the carbon-containing layer.

The capping layer 140 may be a silicon oxynitride layer. The capping layer 140 may also function as a reflection prevention layer during a subsequent photography process. The capping layer 140 may have a thickness of about 200 Å to about 5000 Å. However, the inventive concepts are not limited thereto.

Figure 2A:
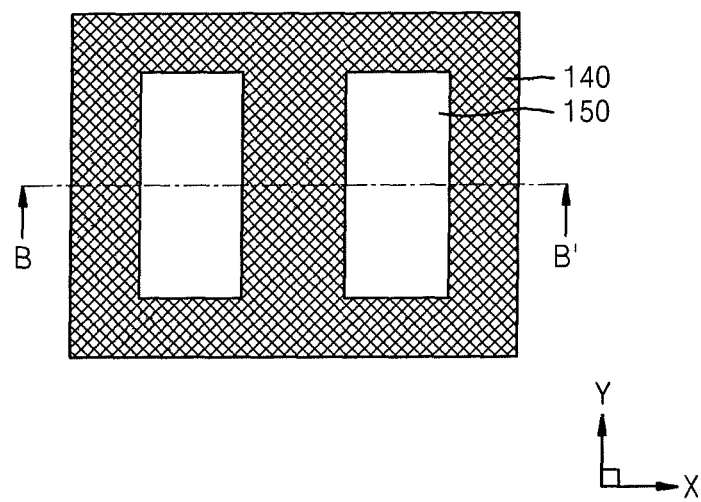
Figure 2B:
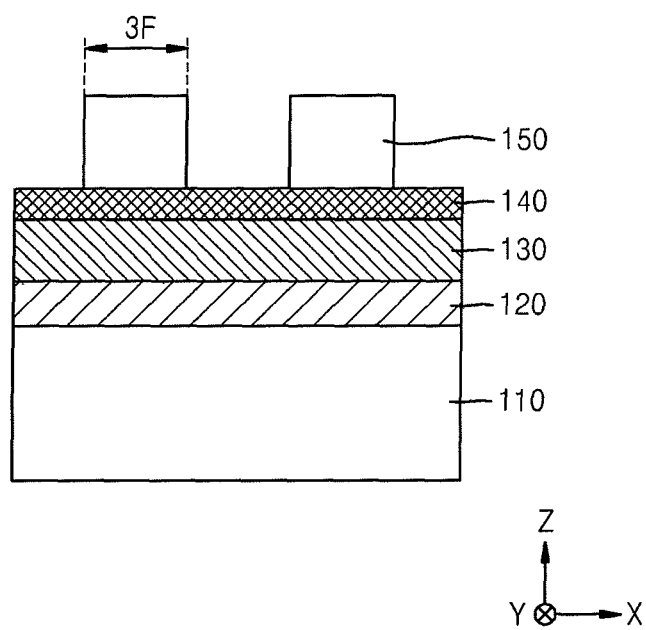

Referring to FIGS. 2A and 2B, a mask pattern 150 covering a portion of the capping layer 140 is formed on the capping layer 140.

The mask pattern 150 may have a width 3F that is three times a feature size 1F of a pattern to be finally formed in the substrate 110 in a first direction (i.e., the X direction in FIG. 2A).

The mask pattern 150 may be a photoresist pattern. Although a planar shape of the mask pattern 150 of FIG. 2A is approximately a rectangle, the inventive concepts are not limited thereto and the mask pattern 150 having one of various planar shapes may be formed.

Figure 3A:
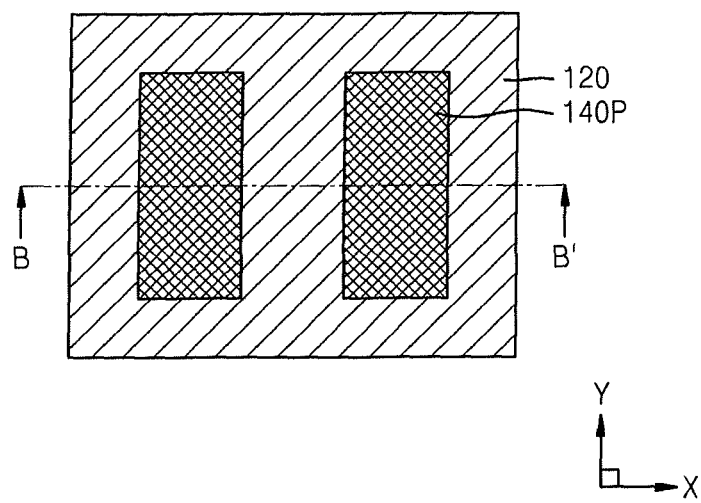
Figure 3B:
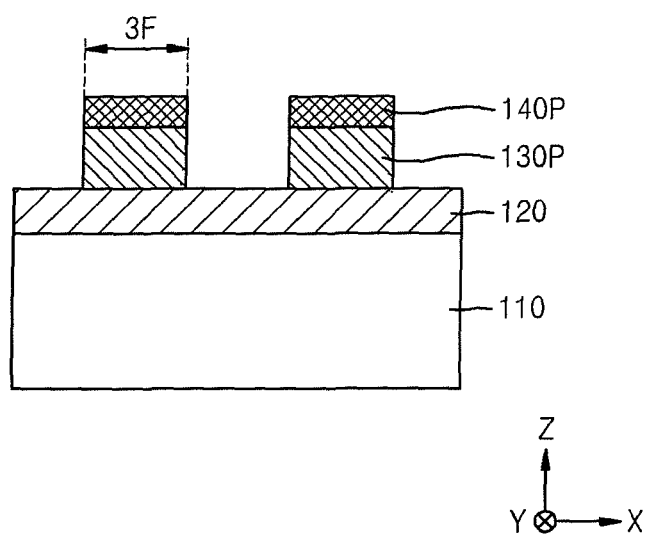

Referring to FIGS. 3A and 3B, the capping layer 140 and the polymer-containing layer 130 may be anisotropically etched in order by using the mask pattern 150 as an etch mask to thereby form a stack structure in which a polymer-containing pattern 130P and a capping pattern 140P are stacked.

The polymer-containing pattern 130P and the capping pattern 140P each may have a width 3F that is three times a feature size 1F of a pattern to be finally formed in the substrate 110 in a first direction (i.e., the X direction in FIG. 2A).

Figure 4A:
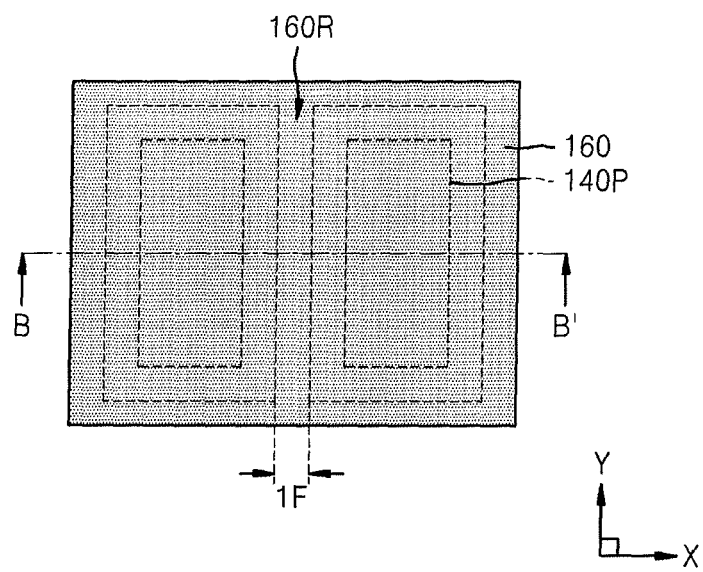
Figure 4B:
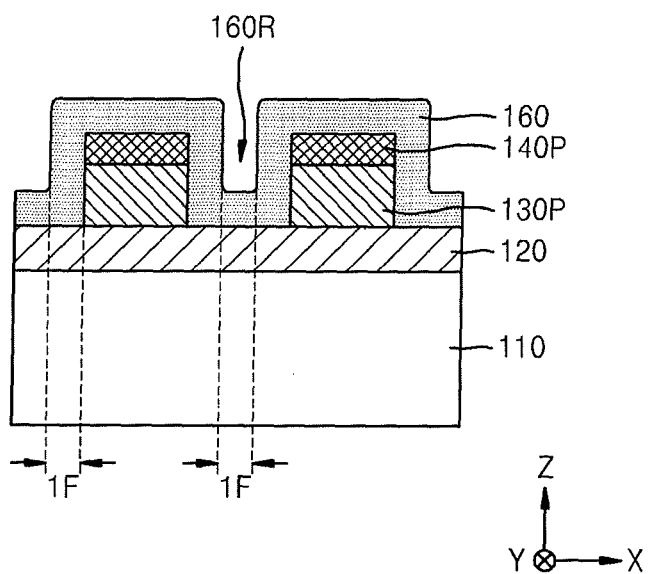

Referring to FIGS. 4A and 4B, a porous layer 160 is formed to cover the stack structure in which the polymer-containing pattern 130P and the capping pattern 140P are stacked.

In some embodiments, the density of the porous layer 160 is lower than that of the capping pattern 140P. For example, when the capping pattern 140P is formed of silicon oxynitride, the porous layer 160 may be formed of silicon oxide.

The porous layer 160 may be formed to conformally cover an exposed surface of the feature layer 120, an exposed surface of the polymer-containing pattern 130P, and an exposed surface of the capping pattern 140P. For example, the porous layer 160 may be formed by an atomic layer deposition (ALD) process. For example, the porous layer 160 may be formed to have a width of about 1F.

After the porous layer 160 is formed, a recess area 160R having a width of about 1F may be formed on the porous layer 160 in a space between the stack structures in which the polymer-containing pattern 130P and the capping pattern 140P are stacked. In FIG. 4A, a range defined by the recess area 160R is indicated by a dotted line for the convenience of understanding.

Figure 5A:
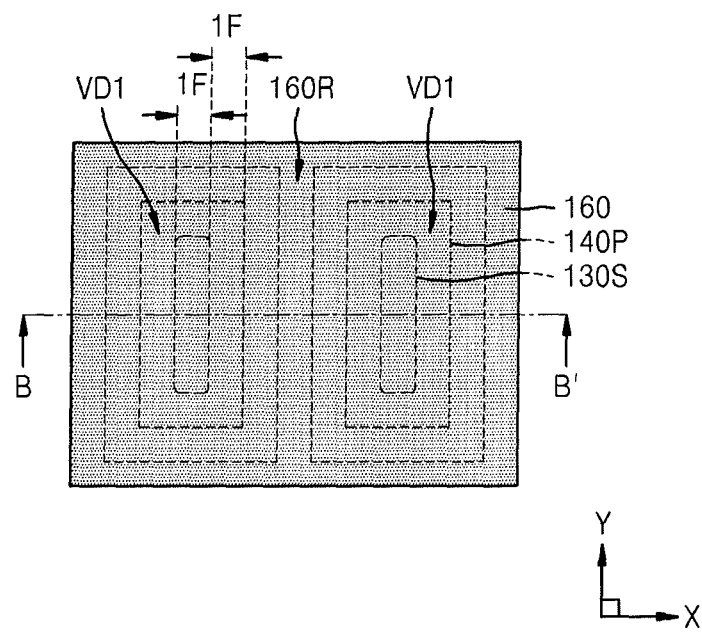
Figure 5B:
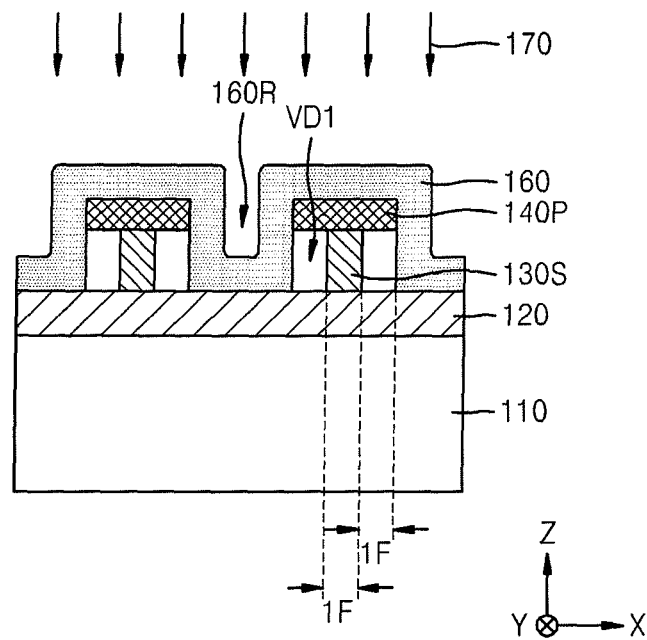

Referring to FIGS. 5A and 5B, a portion of the polymer-containing pattern 130P is decomposed by using a decomposition gas 170 passing through the porous layer 160, and thus, a reduced polymer-containing pattern 130S is formed and a void VD1 is formed between the reduced polymer-containing pattern 130S and the porous layer 160.

In order to form the void VD1, an asking process may be performed by using an oxygen gas as the decomposition gas 170. The ashing process may be performed in an ashing chamber that maintains an internal temperature of about 40° C. to about 300° C. For example, oxygen plasma may be generated from an oxygen gas in an ashing chamber of a plasma asking apparatus, and the generated oxygen plasma may decompose a portion of the polymer-containing pattern 130P (refer to FIGS. 4A and 4B) from a sidewall of the polymer-containing pattern 130P after passing through the porous layer 160P. Thus, the width of the polymer-containing pattern 130P may be reduced, and as a result, the reduced polymer-containing pattern 130S may be obtained.

Since the upper surface of the polymer-containing pattern 130P is covered with the capping pattern 140P having a higher density than the porous layer 160, a path through which the decomposition gas 170 passing through the porous layer 160 reaches the upper surface of the polymer-containing pattern 130P may be blocked by the capping pattern 140P. Accordingly, a decomposition speed from the sidewall of the polymer-containing pattern 130P may be higher than that from the upper surface of the polymer-containing pattern 130P.

The void VD1 may be formed to have a ring shape around the reduced polymer-containing pattern 130S in a space surrounded by the porous layer 160.

In some embodiments, a decomposition time of the sidewall of the polymer-containing pattern 130P and the amount of decomposition thereof may be controlled so that each of the void VD1 and the reduced polymer-containing pattern 130S has a width of 1F in the first direction (i.e., the X direction in FIG. 5A).

Figure 6A:
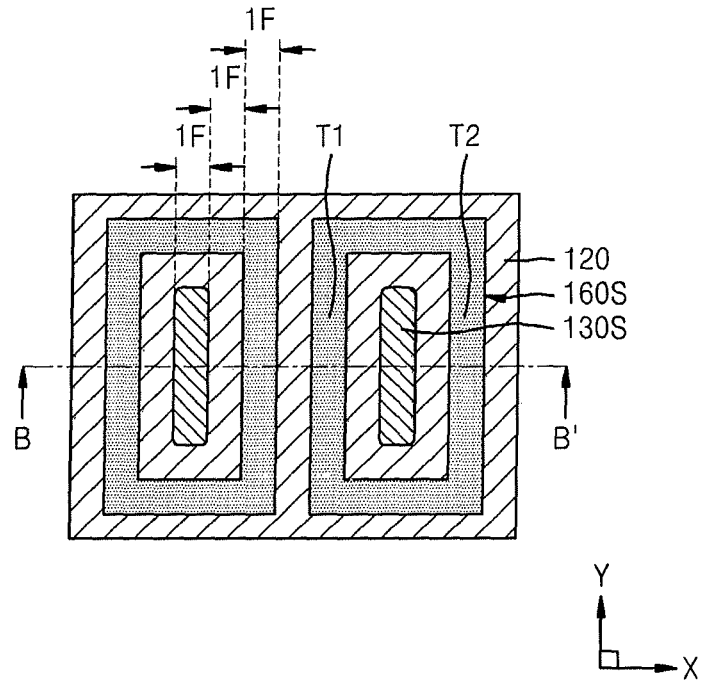
Figure 6B:
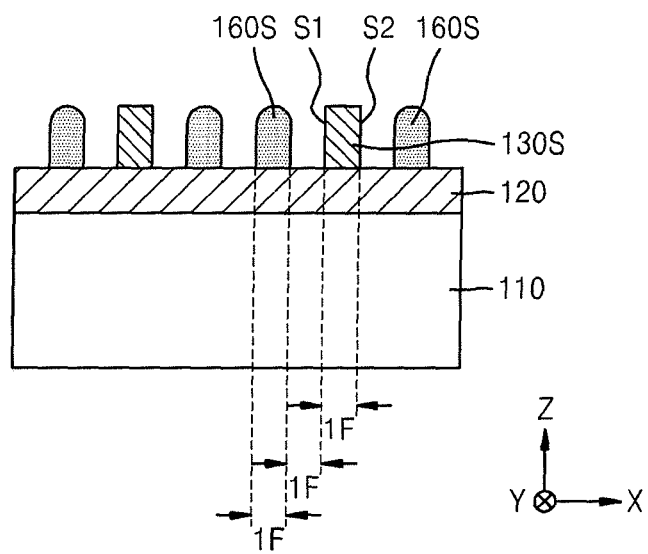

Referring to FIGS. 6A and 6B, a portion of the porous layer 160 and the capping pattern 140P (refer to FIG. 5A) are removed so that a plurality of porous spacer patterns 160S remain at a position spaced apart from the reduced polymer-containing pattern 130S.

In some embodiments, in order to make a plurality of reduced polymer-containing patterns 130S and a plurality of porous spacer patterns 160S remain on the feature layer 120, an etch back process may be performed on the porous layer 160 to expose the capping pattern 140P, and then the exposed capping pattern 140P may be removed. A portion of the porous layer 160 which covers the sidewall of the capping pattern 140P, may be consumed during the removing the exposed capping pattern 140P, and thus, the plurality of porous spacer patterns 160S may remain.

The plurality of reduced polymer-containing patterns 130S and the plurality of porous spacer patterns 160S each may have a width of 1F on the feature layer 120 and may be disposed at a position spaced apart from each other by a width of 1F.

The porous spacer patterns 160S include a pair of tripling portions T1 and T2 that are spaced apart from and face both sidewalls S1 and S2 of the reduced polymer-containing pattern 130S.

Figure 7A:
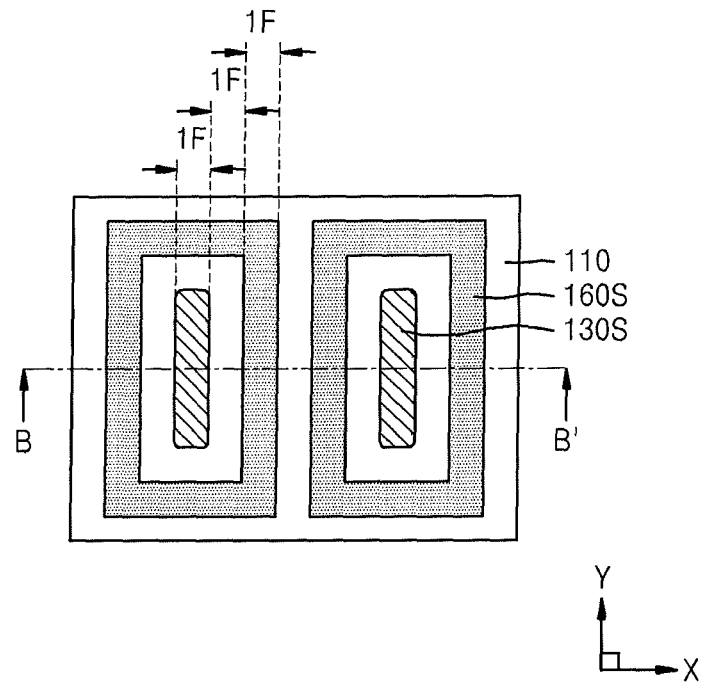
Figure 7B:
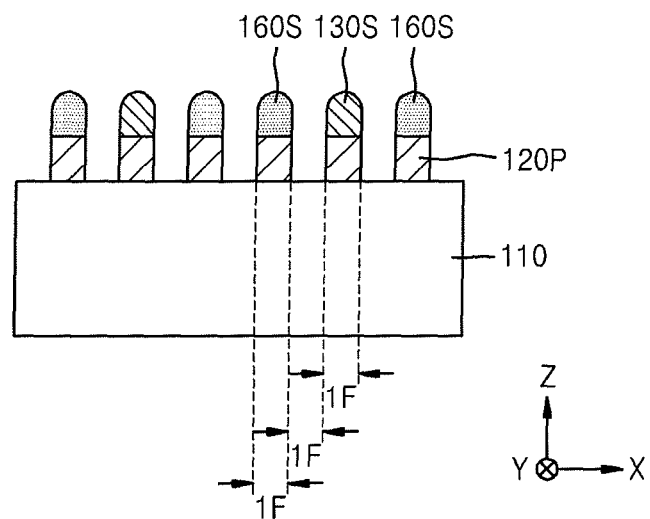

Referring to FIGS. 7A and 7B, the feature layer 120 is etched by using the plurality of reduced polymer-containing patterns 130S and the plurality of porous spacer patterns 160S as an etch mask to thereby form a plurality of feature patterns 120P.

Figure 8A:
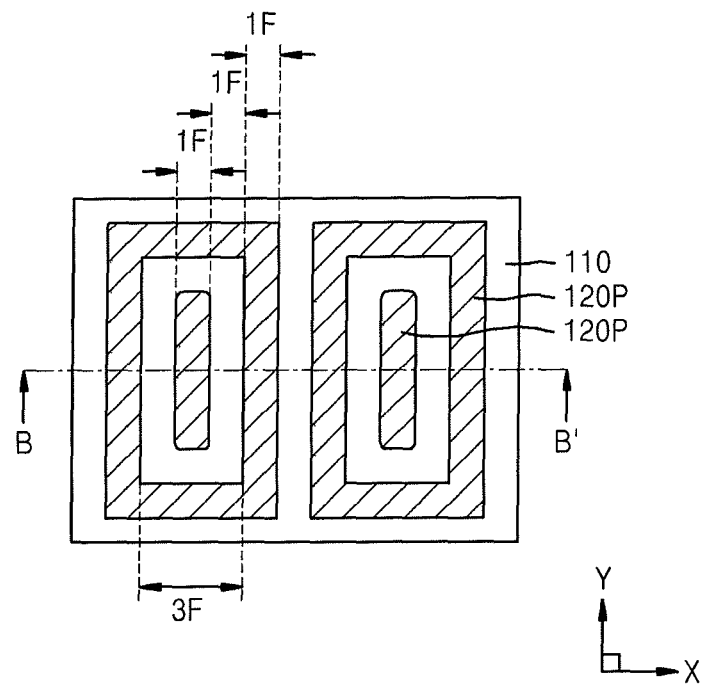
Figure 8B:
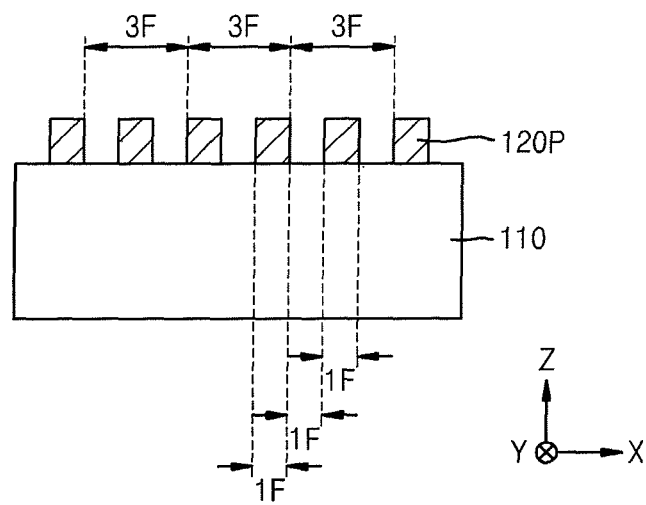

Referring to FIGS. 8A and 8B, unnecessary layers remaining on the plurality of feature patterns 120P are removed to expose the upper surfaces of the plurality of feature patterns 120P.

The plurality of feature patterns 120P may include a plurality of line pattern portions that are repeatedly disposed to have a width of about 1F with an interval of about 1F therebetween in the first direction (i.e., the X direction of FIG. 8A). In addition, a pattern tripling effect, in which one mask pattern 150 formed as described with reference to FIGS. 2A and 2B is divided into three feature patterns 120P in the first direction (i.e., the X direction of FIG. 8A), may be obtained. In this manner, patterns, which are repeatedly formed to have a fine pitch exceeding the limit of the resolution in a photolithography process by using a triple patterning process, may be formed by a low cost and simplified process by using a photolithography process only once. Accordingly, a semiconductor device having various structures may be easily formed by a simplified process, and productivity may be improved by lowering a process cost.

FIGS. 9A to 9H are views for explaining a method of manufacturing a semiconductor device, according to exemplary embodiments and are cross-sectional views illustrating intermediate process steps in a modification example of the manufacturing method of the semiconductor device explained with reference to FIGS. 1A to 8B. In FIGS. 9A to 9H, the same reference numerals as FIGS. 1A to 8B denote the same elements as FIGS. 1A to 8B. Thus, repeated descriptions thereof will not be given.

Figure 9A:
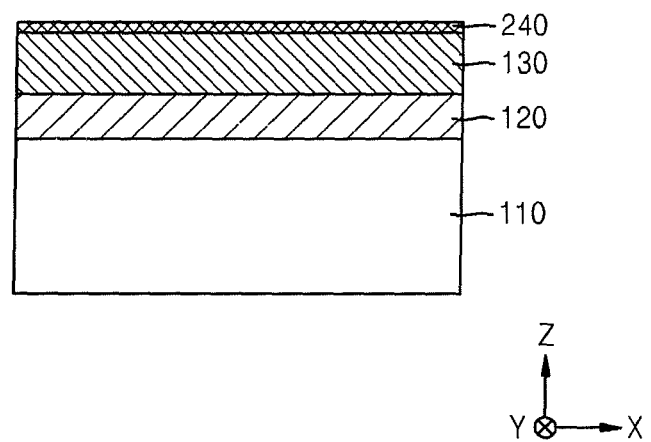
FIGS. 9A to 9H are cross-sectional views illustrating intermediate process steps in a method of manufacturing a semiconductor device according to exemplary embodiments.
Figure 9B:
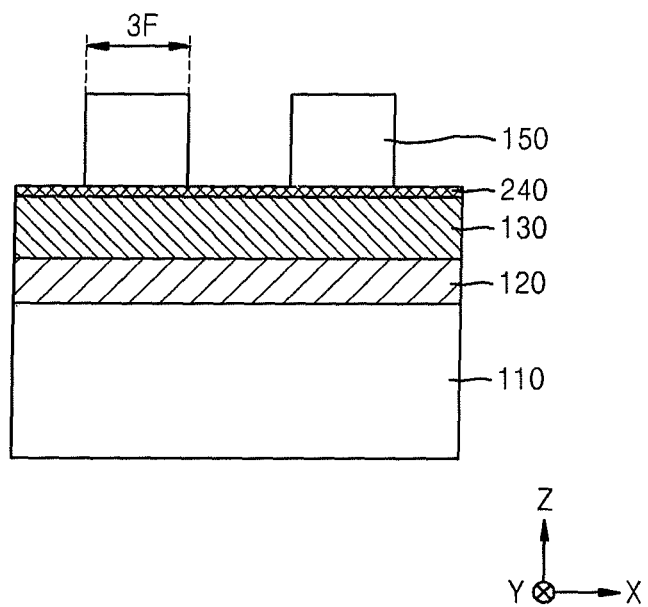

The method to be described with reference to FIGS. 9A to 9H includes processes that are similar to those of the method described with reference to FIGS. 1A to 8B except that a capping layer 240 illustrated in FIGS. 9A and 9B is formed to have a thickness that is smaller than that of the capping layer 140 illustrated in FIGS. 1A and 1B.

Referring to FIG. 9A, a feature layer 120, a polymer-containing layer 130, and the capping layer 240 are sequentially formed on a substrate 110.

The capping layer 240 have a thickness that is smaller than that of a porous layer 160 to be described with reference to FIG. 9D in a subsequent process. For example, the capping layer 240 may have a sufficiently small thickness so that at least a portion of a deposition gas 170 may be passed through the capping layer 240 during an ashing process using the decomposition gas 170, to be described with reference to FIG. 9E in a subsequent process. For example, the capping layer 240 may have a thickness of about 10 Å to about 100 Å. However, the inventive concepts are not limited thereto. The constituent material of the capping layer 240 is the same as that of the capping layer 140 described with reference to FIGS. 1A and 1B.

Referring to FIG. 9B, a mask pattern 150 covering a portion of the capping layer 240 is formed on the capping layer 240 by using the same method as described with reference to FIGS. 2A and 2B.

Figure 9C:
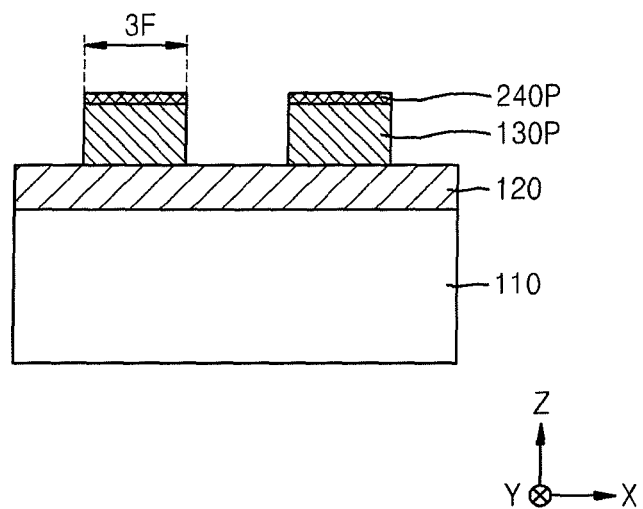

Referring to FIG. 9C, the capping layer 240 and the polymer-containing layer 130 may be anisotropically etched in order by using the mask pattern 150 as an etch mask, with the same method as described with reference to FIGS. 3A and 3B, to thereby form a stack structure in which a polymer-containing pattern 130P and a capping pattern 240P are stacked.

Figure 9D:
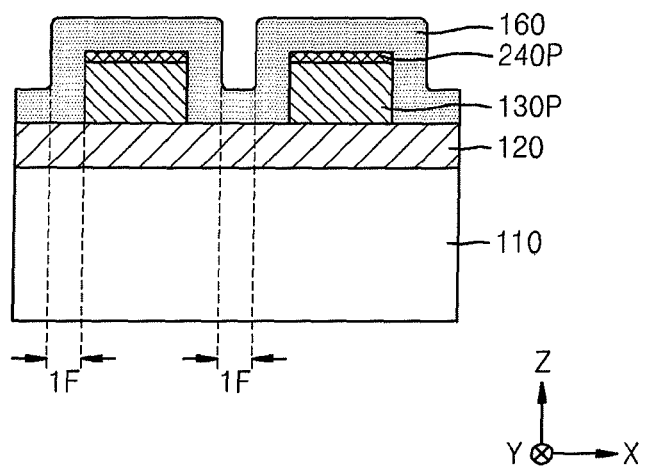

Referring to FIG. 9D, a porous layer 160 is formed to cover the stack structure, in which the polymer-containing pattern 130P and the capping pattern 240P are stacked, by using the same method as described with reference to FIGS. 4A and 4B.

Figure 9E:
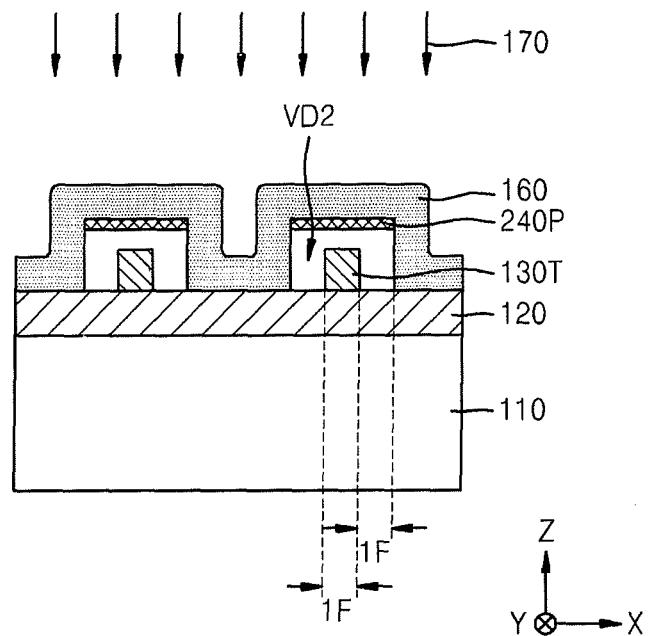

Referring to FIG. 9E, a portion of the polymer-containing pattern 130P is decomposed by using a decomposition gas 170 passing through the porous layer 160, similar to the method described with reference to FIGS. 5A and 5B, and thus, a reduced polymer-containing pattern 130T is formed and a void VD2 is formed between the reduced polymer-containing pattern 130T and the porous layer 160.

The decomposition gas 170 or oxygen plasma generated from the decomposition gas 170 may decompose a portion of the polymer-containing pattern 130P from a sidewall and upper surface of the polymer-containing pattern 130P after passing through the porous layer 160P and the capping pattern 240P having a relatively small thickness. Thus, the width and height of the polymer-containing pattern 130P may be reduced, and as a result, the reduced polymer-containing pattern 130T may be obtained.

Since the upper surface of the polymer-containing pattern 130P is covered with the capping pattern 240P having a higher density and a smaller thickness than the porous layer 160, at least a portion of the decomposition gas 170 passing through the porous layer 160 on the upper surface of the polymer-containing pattern 130P (refer to FIG. 9D) may reach the upper surface of the polymer-containing pattern 130P after passing through the capping pattern 240P. Accordingly, due to the decomposition gas 170 or the oxygen plasma generated from the decomposition gas 170, the polymer-containing pattern 130P may be decomposed from the upper surface of the polymer-containing pattern 130P as well as the sidewall of the polymer-containing pattern 130P. In some embodiments, a decomposition speed from the sidewall of the polymer-containing pattern 130P may be equal to or higher than that from the upper surface of the polymer-containing pattern 130P.

As a result, the void VD2 may be formed to have an inverted-U shaped-cross section around the reduced polymer-containing pattern 130T in a space surrounded by the porous layer 160.

In some embodiments, a decomposition time from the sidewall of the polymer-containing pattern 130P, a decomposition time from the upper surface of the polymer-containing pattern 130P, and the amount of decomposition may be controlled so that the void VD2 and the reduced polymer-containing pattern 130T each have a width of 1F in the first direction (i.e., the X direction in FIG. 9E).

Figure 9F:
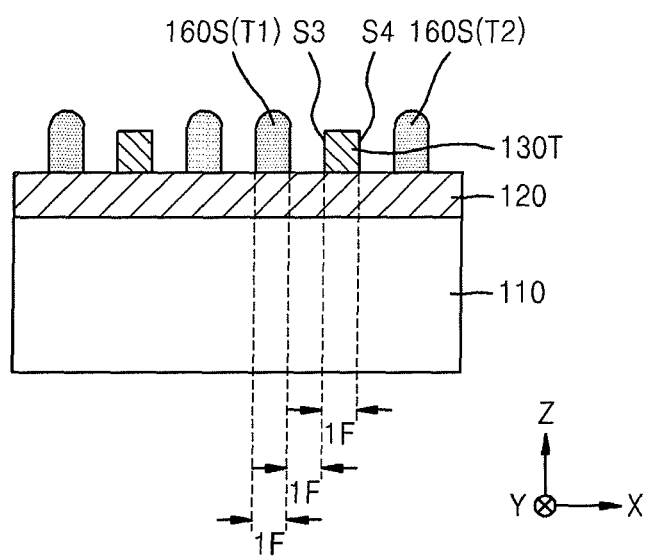

Referring to FIG. 9F, a portion of the porous layer 160 and the capping pattern 240P (refer to FIG. 9E) are removed by using the same method as described with reference to FIGS. 6A and 6B so that a porous spacer pattern 160S, which includes a pair of tripling portions T1 and T2 facing both sidewalls S3 and S4 of the reduced polymer-containing pattern 130T, respectively, remain.

The plurality of reduced polymer-containing patterns 130T and the plurality of porous spacer patterns 160S each may have a width of 1F on the feature layer 120 and may be disposed to be spaced apart from each other by a width of 1F.

Figure 9G:
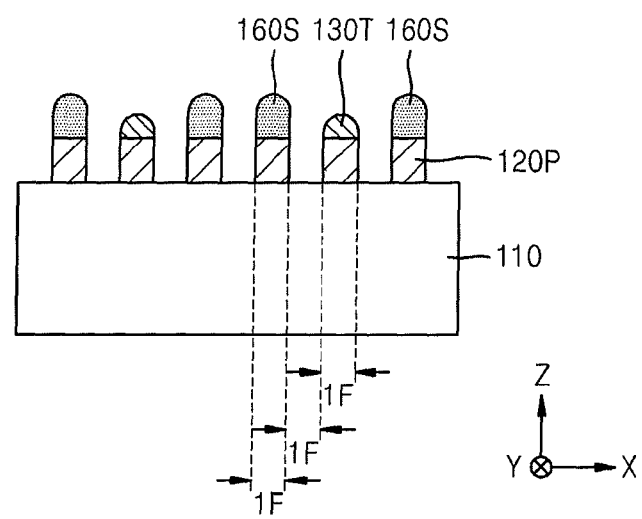

Referring to FIG. 9G, the feature layer 120 is etched by using the plurality of reduced polymer-containing patterns 130T and the plurality of porous spacer patterns 160S as an etch mask, similar to the method described with reference to FIGS. 7A and 7B, to thereby form a plurality of feature patterns 120P.

Figure 9H:
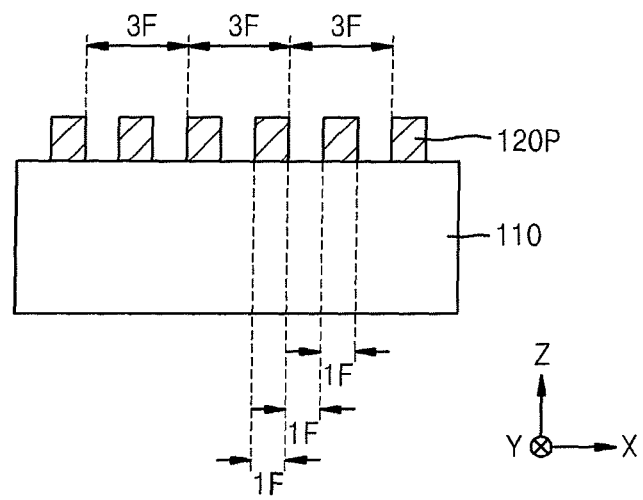

Referring to FIG. 9H, unnecessary layers remaining on the plurality of feature patterns 120P are removed by using the same method as described with reference to FIGS. 8A and 8B to expose the upper surfaces of the plurality of feature patterns 120P.

Figure 10:
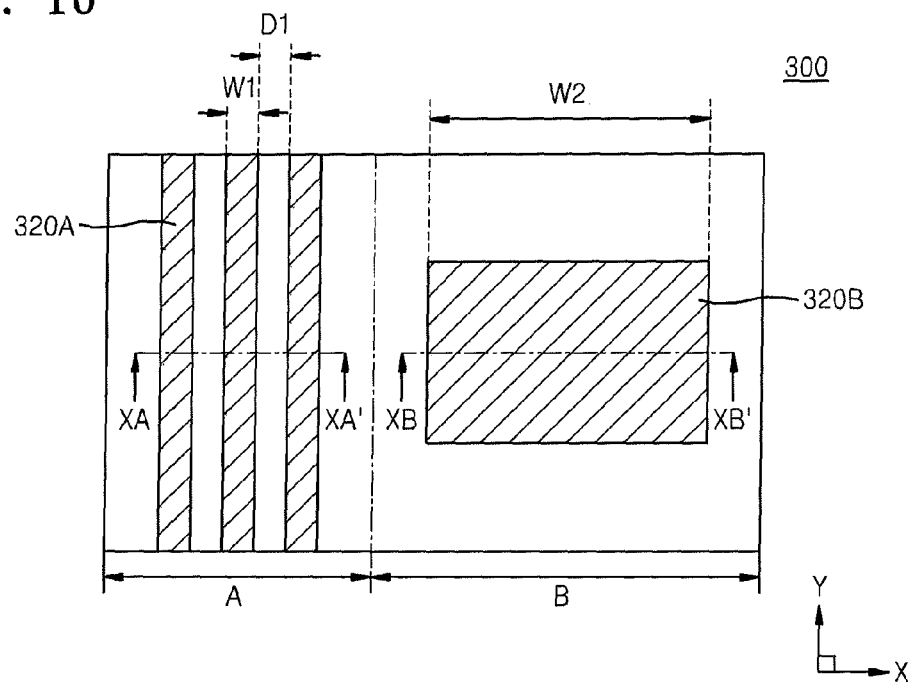
FIG. 10 illustrates a layout of a portion of an exemplary semiconductor device that may be implemented by using a method of manufacturing a semiconductor device according to exemplary embodiments.

FIG. 10 is a layout of a portion of an exemplary semiconductor device 300 that may be implemented by using a method of manufacturing a semiconductor device according to exemplary embodiments.

In FIG. 10, the semiconductor device 300 includes a first area A and a second area B, which have different pattern densities. The first area A may be a cell array area in which unit memory devices are formed. The second area B may be a peripheral circuit area or a core area in which peripheral circuits for driving the unit memory devices formed in the first area A are formed. Alternatively, the second area B may be a portion of the cell array area, in which patterns each having a relatively large width are formed.

In FIG. 10, the first area A may include pattern structures in which at least three first feature patterns 320A each having a first width W1 which is relatively small are adjacent to each other with an first interval D1, which is relatively small, therebetween. In the first area A, the first width W1 and the first interval D1 may be designed according to the type and desired characteristics of a unit device to be formed. For example, the first width W1 and the interval D1 may be equal to each other. Alternatively, the first width W1 may be larger or smaller than the first interval D1.

The second area B includes a second feature pattern 320B having a second width W2 that is relatively large.

For example, the first feature patterns 320A may form an active area or conductive layer of the cell array area. The second feature pattern 320B may form an active area or conductive pattern of the peripheral circuit area. Alternatively, the second feature pattern 320B may form a conductive pattern of the cell array area. The second feature pattern 320B may form an align key. The first feature patterns 320A and the second feature pattern 320B may be separate from each other as illustrated in FIG. 10. Although not illustrated, the first feature patterns 320A and the second feature pattern 320B may be connected to each other via a connection portion (not shown), which is positioned therebetween, to thereby form a one body-type structure.

FIGS. 11A to 11G are cross-sectional views illustrating intermediate process steps in an exemplary process for manufacturing the semiconductor device 300 illustrated in FIG. 10 according to exemplary embodiments. In FIGS. 11A to 11G, the same reference numerals as FIGS. 1A to 8B denote the same elements as FIGS. 1A to 8B. Thus, repeated descriptions thereof will not be given.

A portion corresponding to an XA-XA' line cross section of FIG. 10 is illustrated in a first area A of FIGS. 11A to 11G, and a portion corresponding to an XB-XB' line cross section of FIG. 10 is illustrated in a second area B of FIGS. 11A to 11G.

Figure 11A:
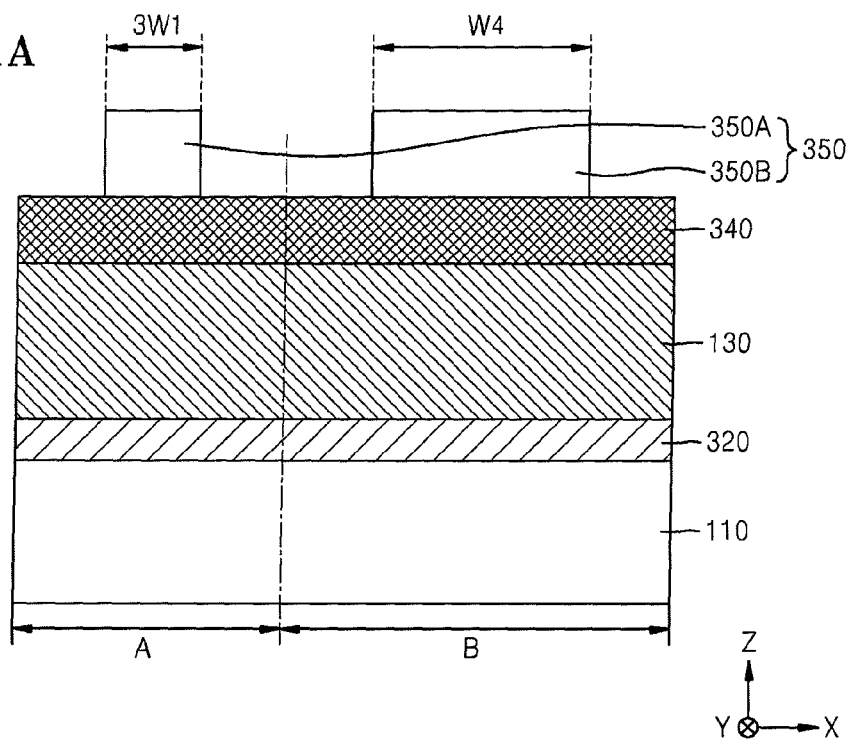
FIGS. 11A to 11G are cross-sectional views illustrating intermediate process steps in an exemplary process for manufacturing the semiconductor device of FIG. 10 according to exemplary embodiments.

Referring to FIG. 11A, a feature layer 320, a polymer-containing layer 130, and a capping layer 340 are sequentially formed in the first area A and the second area B on a substrate 110. Next, a mask pattern 350 covering a portion of the capping layer 340 is formed on the capping layer 340.

Details of the feature layer 320 are the same as those of the feature layer 120 described with reference to FIGS. 1A and 1B.

The capping layer 340 may have a thickness that is equal to or larger than that of a porous layer 160 to be described with reference to FIG. 11C in a subsequent process. For example, the capping layer 340 may have a thickness of about 200 Å to about 6000 Å. However, the inventive concepts are not limited thereto. The constituent material of the capping layer 340 is the same as that of the capping layer 140 described with reference to FIGS. 1A and 1B.

The mask pattern 350 includes a first mask portion 350A having a third width 3W1 that is three times the first width W1 of the plurality of first feature patterns 320A (refer to FIG. 10) to be finally formed in the first area A, and a second mask portion 350B having a fourth width W4 that is smaller than the second width W2 of the second feature pattern 320B to be finally formed in the second area B. The first mask portion 350A and the second mask portion 350B may be simultaneously formed by using a photolithography process only once, which uses one photomask.

The mask pattern 350 may be formed by using a photolithography process. The mask pattern 350 may include a photoresist layer. Alternatively, the mask pattern 350 may include a stack structure in which a reflection prevention layer and a photoresist layer are stacked.

In the mask pattern 350, the third width 3W1 of the first mask portion 350A formed in the first area A may correspond to three times a minimum feature size of a semiconductor device to be formed. For example, the third width 3W1 of the first mask portion 350A may be from about several nanometers to about several hundred nanometers. The fourth width W4 of the second mask portion 350B formed in the second area B is larger than the third width 3W1.

Figure 11B:
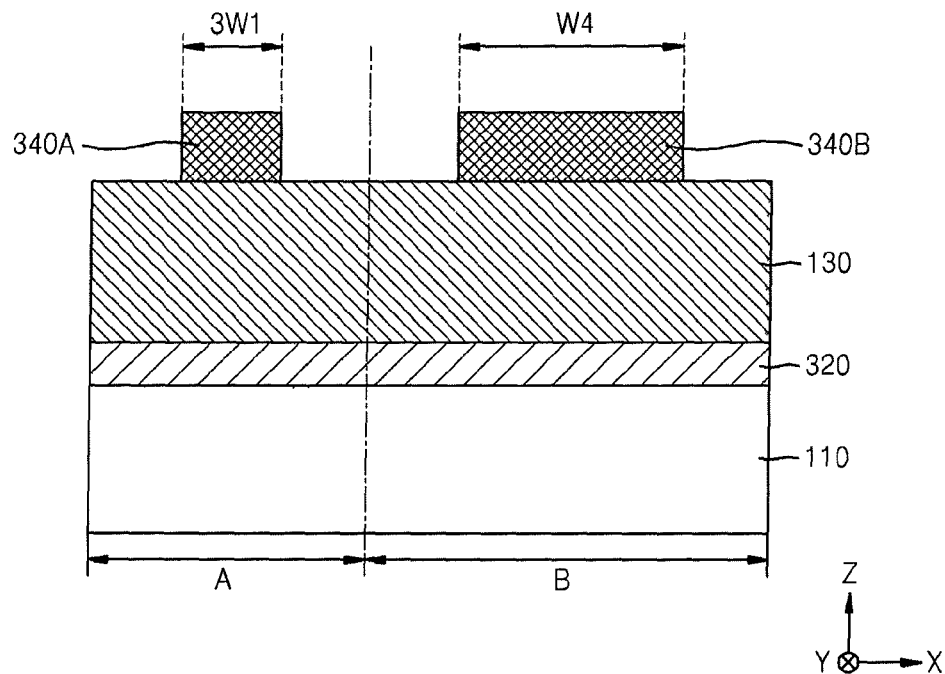

Referring to FIG. 11B, the capping layer 340 is anisotropically etched by using the mask pattern 350 as an etch mask in the first and second areas A and B, and thus, a first capping pattern 340A is formed in the first area A and a second capping pattern 340B is formed in the second area B. Since the width of the mask pattern 350 is transcribed into the capping layer 340, the first capping pattern 340A formed in the first area A may have a width corresponding to the third width 3W1 of the first mask portion 350A and the second capping pattern 340B formed in the second area B may have a width corresponding to the fourth width W4 of the second mask portion 350B.

After the first capping pattern 340A and the second capping pattern 340B are formed, the mask pattern 350 is removed to expose the upper surface of the first capping pattern 340A and the upper surface of the second capping pattern 340B.

Figure 11C:
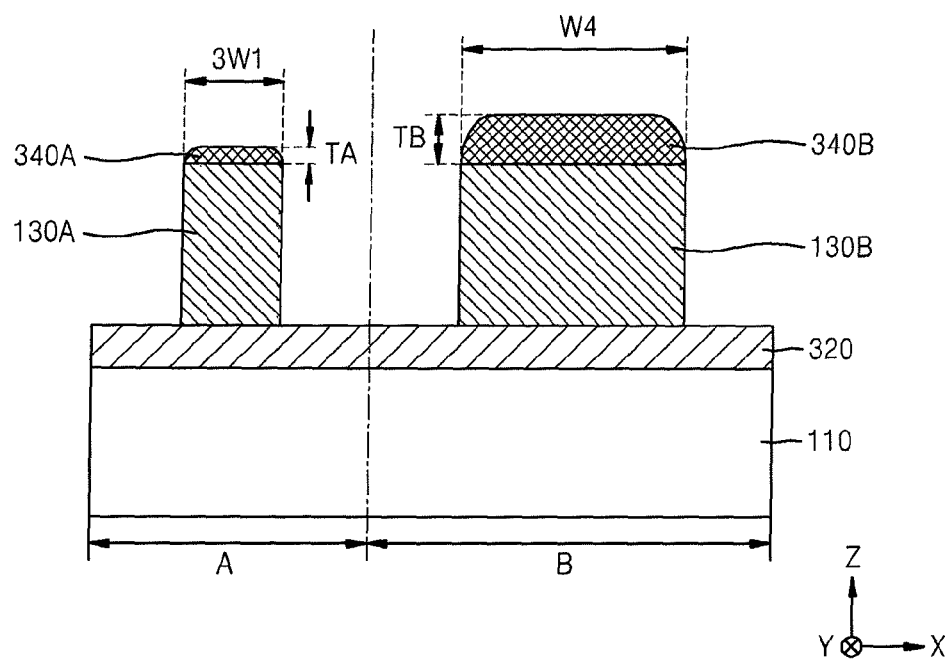

Referring to FIG. 11C, the polymer-containing layer 130 is anisotropically etched by using the first capping pattern 340A and the second capping pattern 340B as an etch mask, and thus, a first polymer-containing pattern 130A is formed in the first area A and a second polymer-containing pattern 130B is formed in the second area B.

The first polymer-containing pattern 130A may have a width corresponding to the third width 3W1 of the first mask portion 350A, and the second polymer-containing pattern 130B may have a width corresponding to the fourth width W4 of the second mask portion 350B.

A portion of the first capping pattern 340A and/or a portion of the second capping pattern 340B may be consumed while anisotropically etching the polymer-containing layer 130 to form the first polymer-containing pattern 130A and the second polymer-containing pattern 130B.

In particular, the first capping pattern 340A formed in the first area A and the second capping pattern 340B formed in the second area B are influenced by an etching atmosphere three-dimensionally in various directions from a direction perpendicular to a main surface of the substrate 110 to a direction that is parallel with the main surface., while the polymer-containing layer 130 is etched. In this case, since the third width 3W1 of the first capping pattern 340A is smaller than the fourth width W4 of the second capping pattern 340B, the first capping pattern 340A is much more influenced by a three-dimensional etching effect. As a result, a thickness consumption of the first capping pattern 340A may be greater than that of the second capping pattern 340A. Accordingly, although the first capping pattern 340A of the first area A and the second capping pattern 340B of the second area B are formed to have the same thickness in the process of FIG. 11B, the thickness TA of the first capping pattern 340A remaining on the first polymer-containing pattern 130A may be smaller than the thickness TB of the second capping pattern 340B remaining on the second polymer-containing pattern 130B after the first polymer-containing pattern 130A and the second polymer-containing pattern 130B are formed in the first area A and the second area B, respectively. As a difference between the third width 3W1 and the fourth width W4 increases, a difference between the thickness TA of the first capping pattern 340A and the thickness TB of the second capping pattern 340B may increase.

Figure 11D:
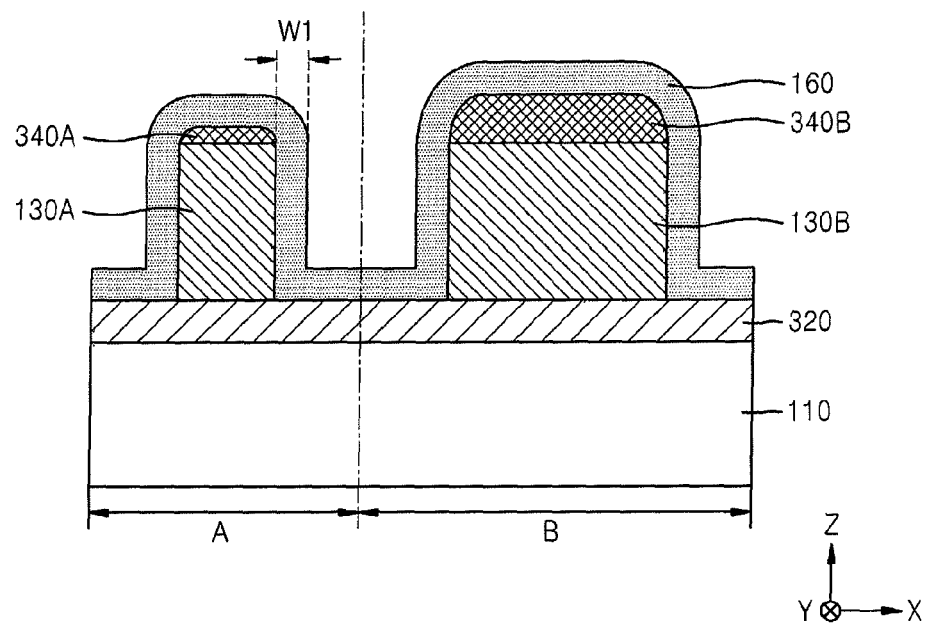

Referring to FIG. 11D, a porous layer 160 is formed on a resultant structure, in which the first and second polymer-containing patterns 130A and 130B was formed, by using a method that is similar to that described with reference to FIGS. 4A and 4B.

In the first area A, the porous layer 160 may be formed to conformally cover an exposed surface of the feature layer 320 and a stack structure of the first polymer-containing pattern 130A and first capping pattern 340A. In the second area B, the porous layer 160 may be formed to conformally cover an exposed surface of the feature layer 320 and a stack structure of the second polymer-containing pattern 130B and second capping pattern 340B.

The porous layer 160 may have a width that is the same as the first width W1.

Figure 11E:
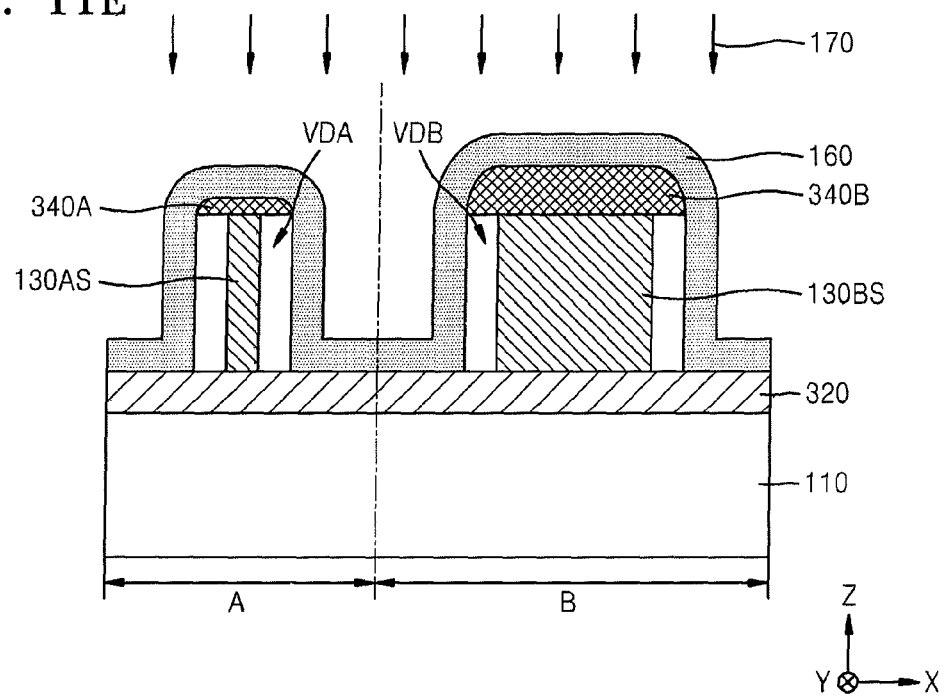

Referring to FIG. 11E, a decomposition gas 170 is supplied to the first polymer-containing pattern 130A and the second polymer-containing pattern 130B through the porous layer 160, and thus, a portion of the first polymer-containing pattern 130A and a portion of the second polymer-containing pattern 130B are decomposed and a reduced first polymer-containing pattern 130AS and a reduced second polymer-containing pattern 130BS are formed. As a result, a first void VDA may be formed between the reduced first polymer-containing pattern 130AS and the porous layer 160, and a second void VDB may be formed between the reduced second polymer-containing pattern 130BS and the porous layer 160.

The first void VDA may be formed to have a ring shape surrounding the reduced first polymer-containing pattern 130AS, and the second void VDB may be formed to have a ring shape surrounding the reduced second polymer-containing pattern 130BS.

Figure 11F:
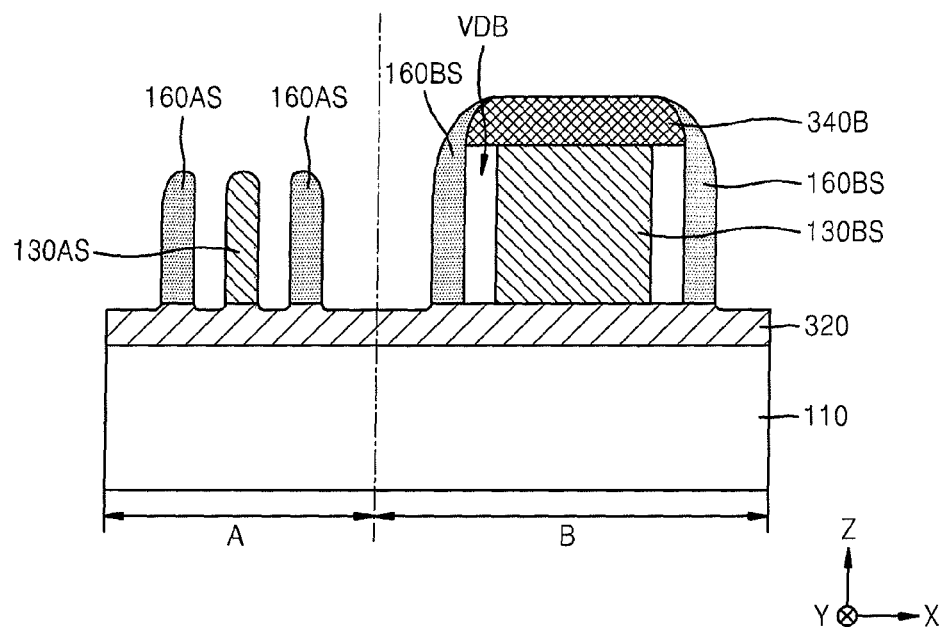

Referring to FIG. 11F, a portion of the porous layer 160 in the first and second areas A and B is removed, and thus, a first porous spacer pattern 160AS that is spaced apart from the reduced first polymer-containing pattern 130AS is formed in the first area A and a second porous spacer pattern 160BS that is spaced apart from the reduced second polymer-containing pattern 130BS is formed in the second area B.

While the first porous spacer pattern 160AS is formed in the first area A, the first capping pattern 340A having a relatively small thickness may also be etched and thus the first void VDA may be opened. On the other hand, in the second area B, the second capping pattern 340B having a relatively large thickness may remain without being removed even after the second porous spacer pattern 160BS is formed. As a result, the second void VDB may remain without being exposed due to a remaining portion of the second capping pattern 340B.

A portion of an exposed upper surface of the feature layer 320 may be consumed due to an over-etching when performing an etch-back process on the porous layer 160 to form the first porous spacer pattern 160AS and the second porous spacer pattern 160BS.

Figure 11G:
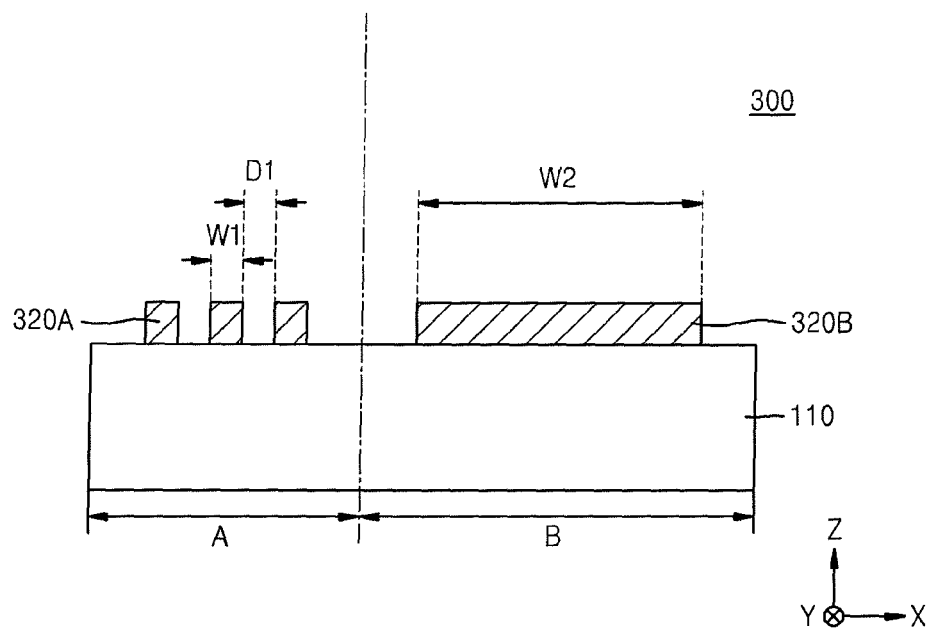

Referring to FIG. 11G, the feature layer 320 in the first area A is etched by using the reduced first polymer-containing pattern 130AS and the first porous spacer pattern 160AS (refer to FIG. 11F) as an etch mask, and the feature layer 320 in the second area B is etched by using the remaining portion of the second capping pattern 340B and the second porous spacer pattern 160BS (refer to FIG. 11F) as an etch mask. Thus, as illustrated in FIG. 10, the first feature pattern 320A and the second feature pattern 320B, which have different widths from each other, are formed in the first area A and the second area B, respectively.

According to the method of manufacturing a semiconductor device, as described with reference to FIGS. 11A to 11G, in the first area A in which pattern widths are relatively small, pattern density may be increased by a triple patterning process using the reduced first polymer-containing pattern 130AS and the first porous spacer pattern 160AS as an etch mask, and thus it is possible to form a structure in which fine patterns exceeding a resolution limit in a photolithography process are repeatedly disposed. In the second area B, when forming patterns each having a relatively large width compared to the first area A, the second mask portion 350B formed at the same time as the first mask portion 340A as illustrated in FIG. 11A, the second capping pattern 340B formed at the same time as the first capping pattern 340A as illustrated in FIG. 11C, and the second porous spacer pattern 160BS formed at the same time as the first porous spacer pattern 160AS as illustrated in FIG. 11F are used. Accordingly, an additional photolithography process is not added when simultaneously forming patterns having different widths in the first area A and the second area B, respectively, and thus, processes may be simplified and process cost may be lowered.

FIGS. 12A to 21B are views for explaining a method of manufacturing a semiconductor device, according to exemplary embodiments. FIGS. 12A to 21A are plan views illustrating intermediate process steps in a method of manufacturing a semiconductor device and FIGS. 12B to 21B are cross sectional views taken along line B-B' of FIGS. 12A to 21A, respectively.

An exemplary process of defining an active area in a substrate is described with reference to FIGS. 12A to 21B. In FIGS. 12A to 21B, the same reference numerals as FIGS. 1A to 11G denote the same elements as FIGS. 1A to 11G. Thus, repeated descriptions thereof will not be given.

Figure 12A:
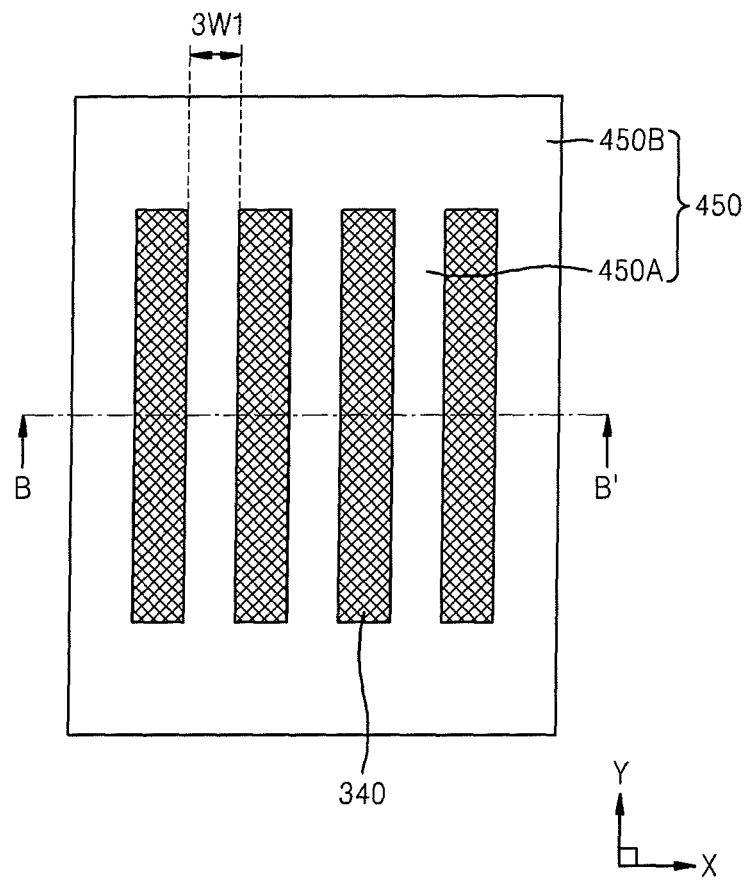
FIGS. 12A to 21B illustrate views of a method of manufacturing a semiconductor device according to exemplary embodiments.
Figure 12B:
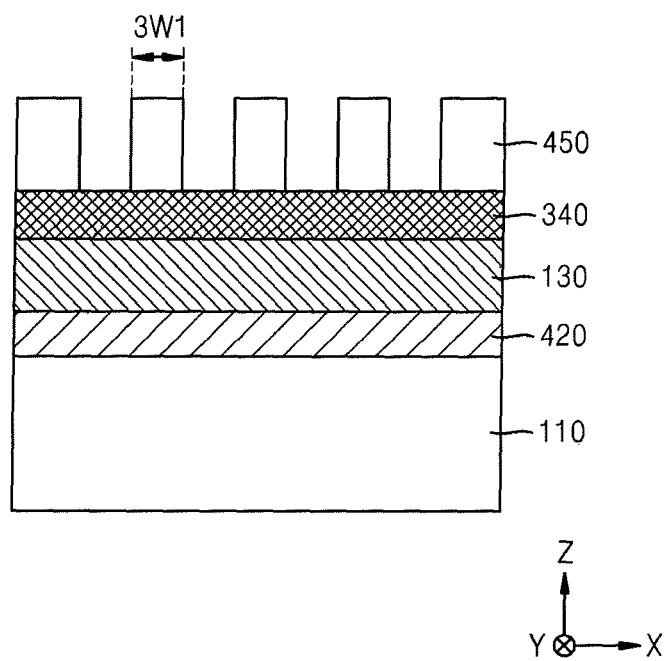

Referring to FIGS. 12A and 12B, a hard mask layer 420, a polymer-containing layer 130, and a capping layer 340 are sequentially formed on a substrate 110. Next, a mask pattern 450, which includes a plurality of first mask portions 450A each having a relatively small third width 3W1 and a second mask portion 450B having a larger width than the plurality of first mask portions 450A, is formed on the capping layer 340. The second mask portion 450B is connected to the plurality of first mask portions 450A in a body to connect the plurality of first mask portions 450A to one another. Both ends of each of the plurality of first mask portions 450A are connected to the second mask portion 450B.

More details of the hard mask layer 420 and the mask pattern 450 are similar to those of the feature layer 320 and the mask pattern 350, as described with reference to FIGS. 11A.

Figure 13A:
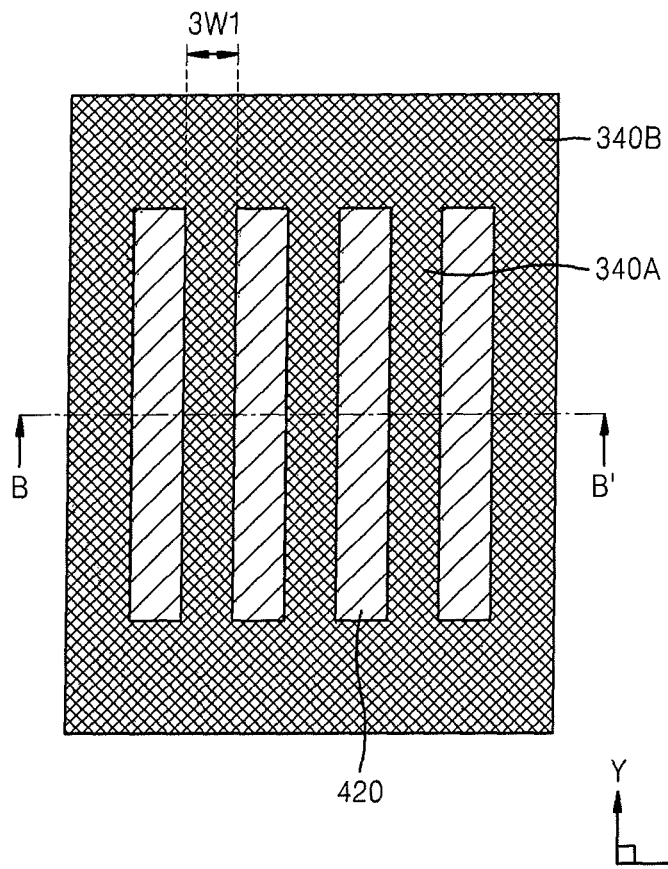
Figure 13B:
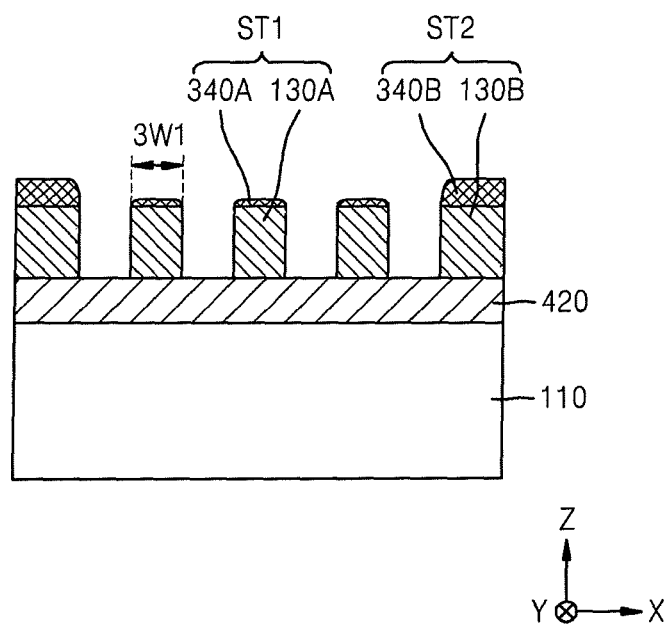

Referring to FIGS. 13A and 13B, a structure in which a first stack structure ST1 and a second stack structure ST2 are connected to each other is formed on the hard mask layer 420 by performing processes as described with reference to FIGS. 11B and 11C on a resultant structure of FIGS. 12A and 12B. The first stack structure ST1 may include a first polymer-containing pattern 130A and a first capping pattern 340A. and the second stack structure ST2 may include a second polymer-containing pattern 130B and a second capping pattern 340B.

Figure 14A:
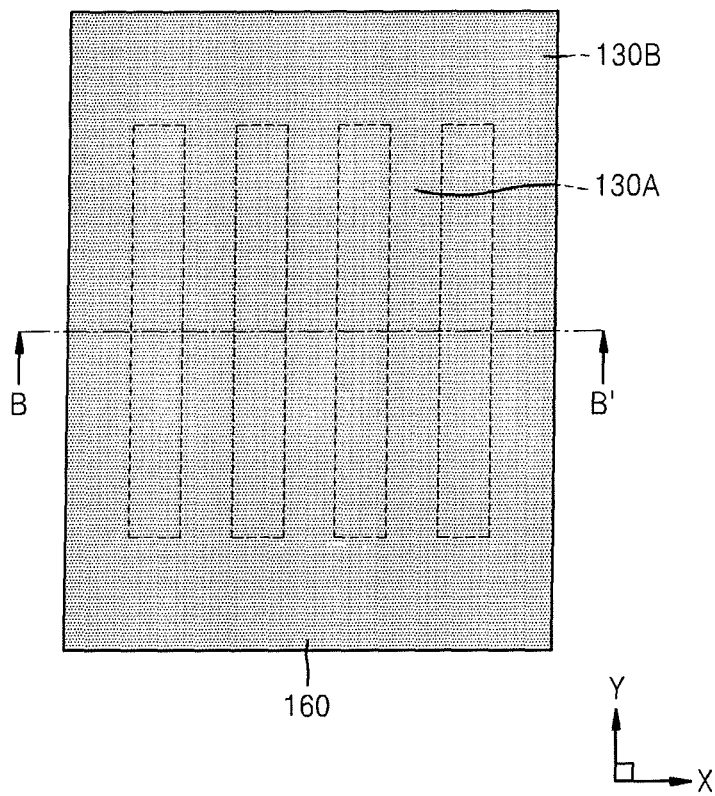
Figure 14B:
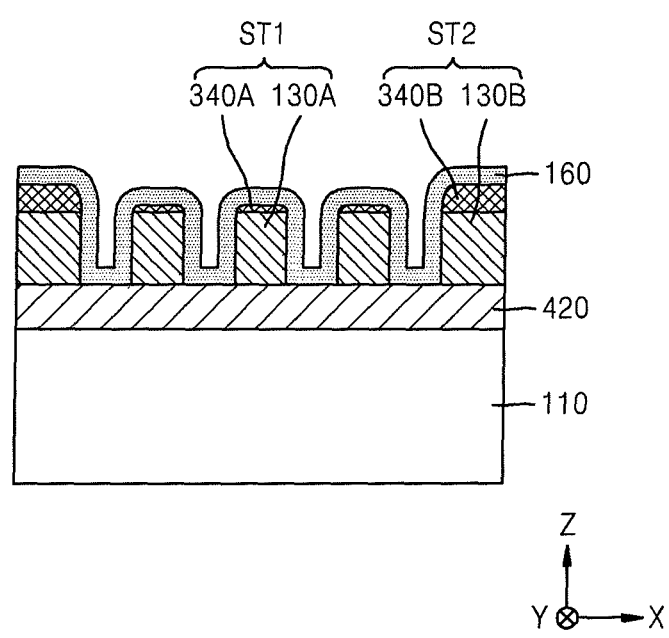

Referring to FIGS. 14A and 14B, a porous layer 160 is formed on a resultant structure with the first and second stack structure ST1 and ST2 formed therein.

In FIG. 14A, planar shapes of the first and second polymer-containing patterns 130A and 130B are indicated by a dotted line for the convenience of understanding.

The porous layer 160 may be formed to conformally cover an exposed surface of the hard mask layer 420, an exposed surface of the first stack structure ST1, and an exposed surface of the second stack structure ST2.

Figure 15A:
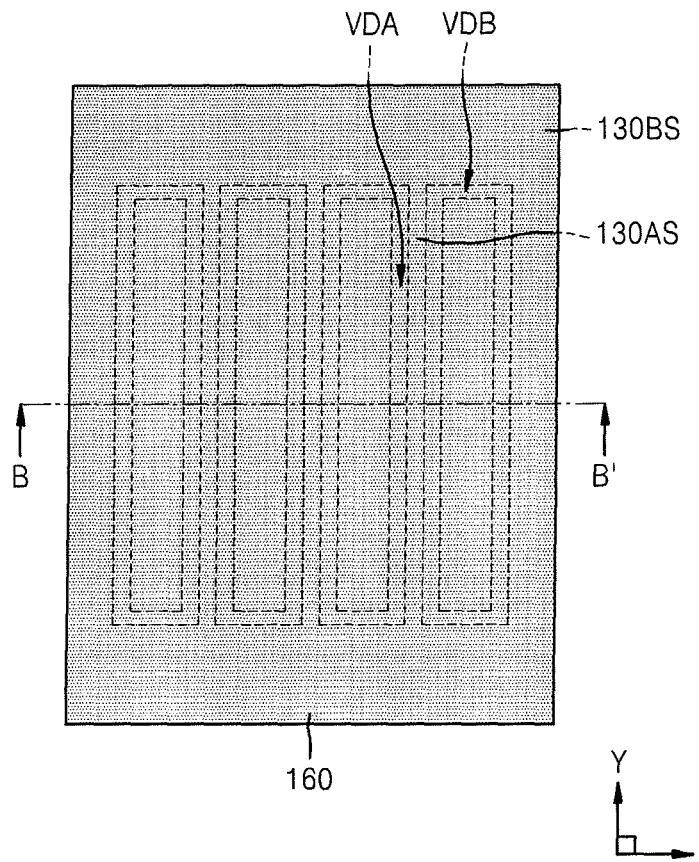
Figure 15B:
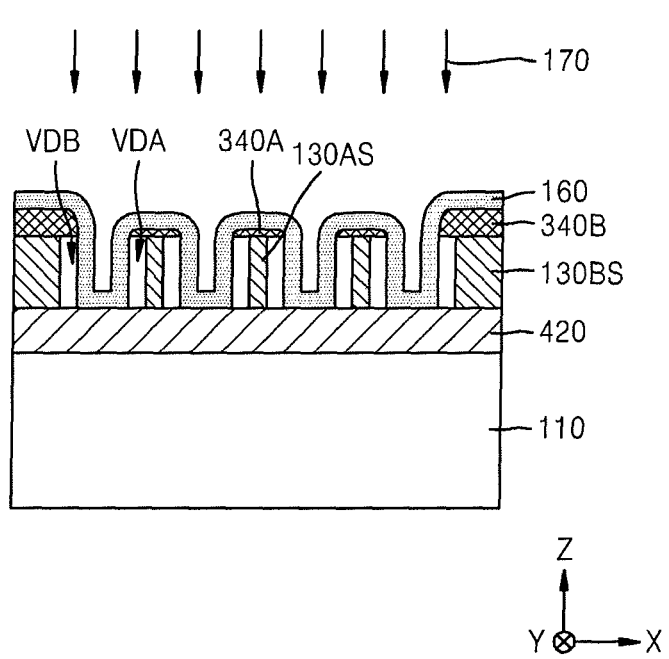

Referring to FIGS. 15A and 15B, a decomposition gas 170 is supplied to the first polymer-containing pattern 130A and the second polymer-containing pattern 130B through the porous layer 160 by using a method that is similar to that described with reference to FIG. 11E, and thus, a portion of the first polymer-containing pattern 130A and a portion of the second polymer-containing pattern 130B are decomposed and a reduced first polymer-containing pattern 130AS and a reduced second polymer-containing pattern 130BS are formed. As a result, a first void VDA may be formed between the reduced first polymer-containing pattern 130AS and the porous layer 160, and a second void VDB may be formed between the reduced second polymer-containing pattern 130BS and the porous layer 160.

In FIG. 15A, planar shapes of the reduced first and second polymer-containing patterns 130AS and 130BS and planar shapes of the first and second voids VDA and VDB are indicated by a dotted line for the convenience of understanding.

Figure 16A:
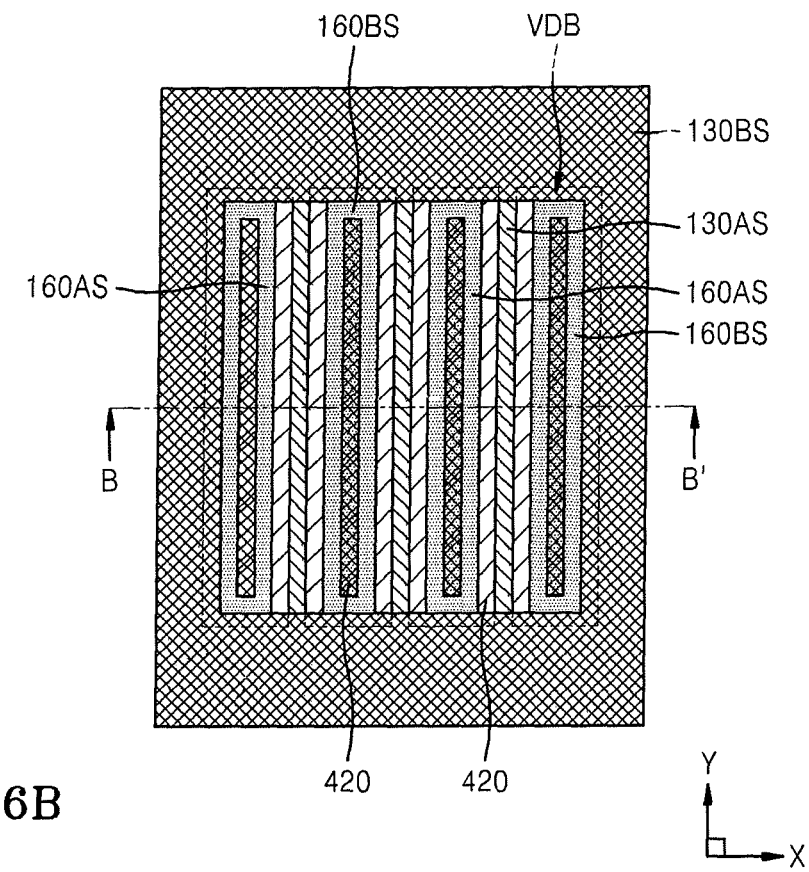
Figure 16B:
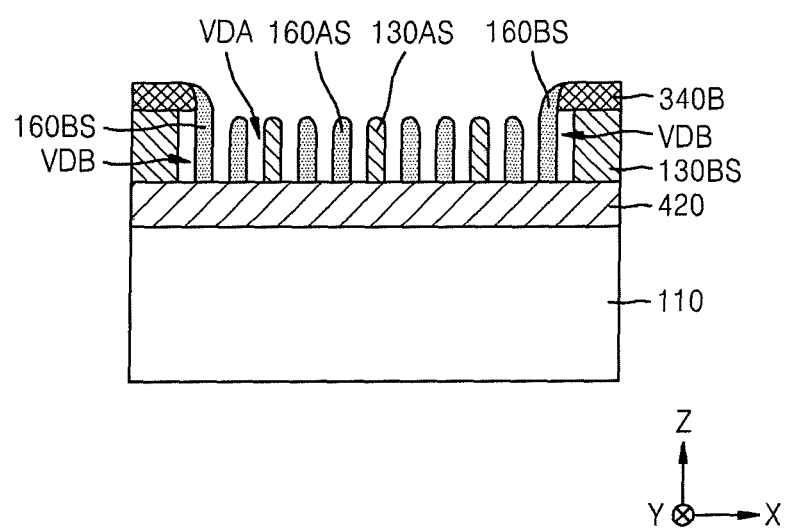

Referring to FIGS. 16A and 16B, a portion of the porous layer 160 is removed by using a method that is similar to that described with reference to FIG. 11, and thus, a first porous spacer pattern 160AS, which is spaced apart from the reduced first polymer-containing pattern 130AS, and a second porous spacer pattern 160BS, which is spaced apart from the reduced second polymer-containing pattern 130BS, are formed.

While the first porous spacer pattern 160AS is formed, the first capping pattern 340A having a relatively small thickness may also be etched and thus the first void VDA may be opened. On the other hand, the second capping pattern 340B having a relatively large thickness remains without being removed after the second porous spacer pattern 160BS is formed. As a result, the second void VDB may be closed down by a remaining portion of the second capping pattern 340B.

In FIG. 16A, a planar shape of the reduced second polymer-containing pattern 130BS and a planar shape of the second void VDB are indicated by a dotted line for the convenience of understanding.

Figure 17A:
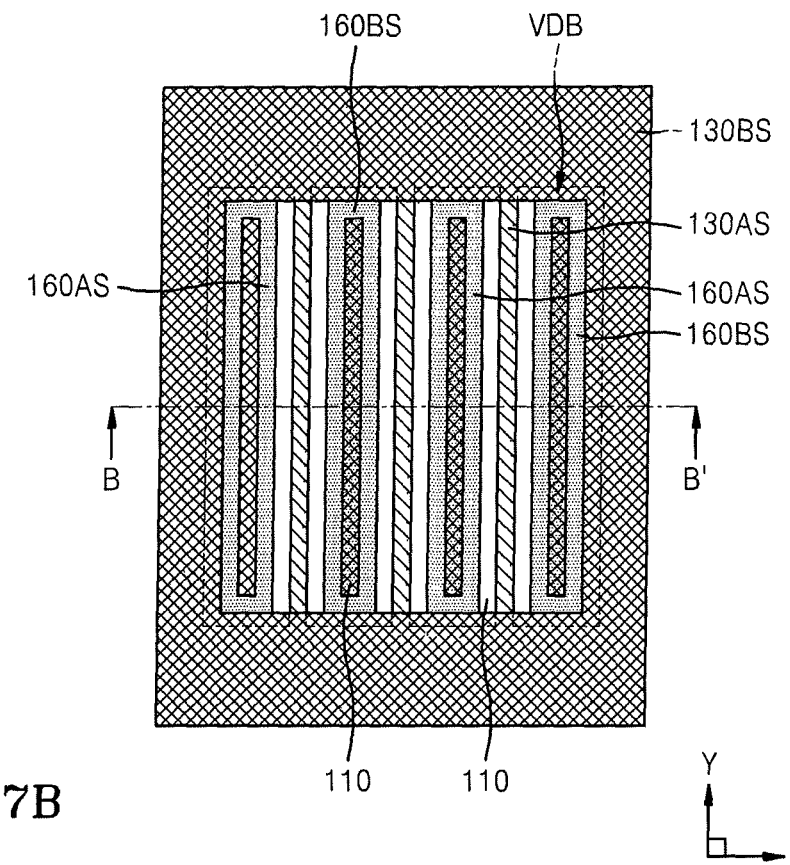
Figure 17B:
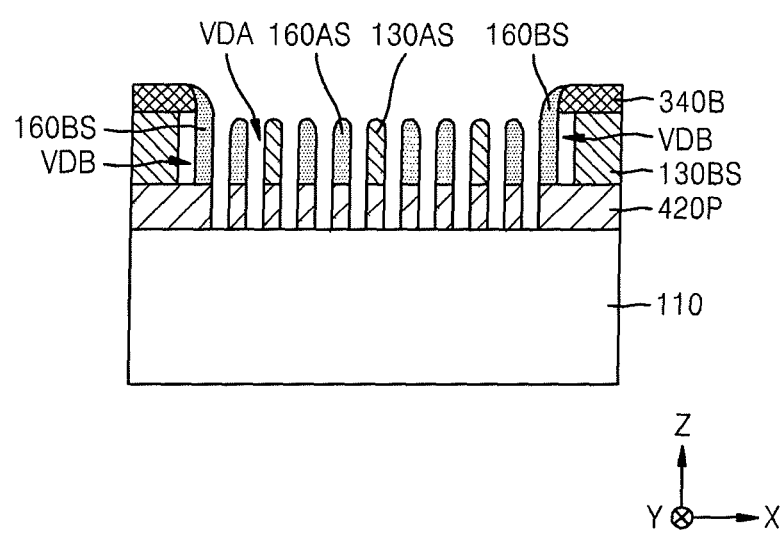

Referring to FIGS. 17A and 17B, the hard mask layer 420 is etched by using the reduced first polymer-containing pattern 130AS, the first porous spacer pattern 160AS, a remaining portion of the second capping pattern 340B, and the second porous spacer pattern 160BS as an etch mask, and thus, a hard mask pattern 420P is formed.

Figure 18A:
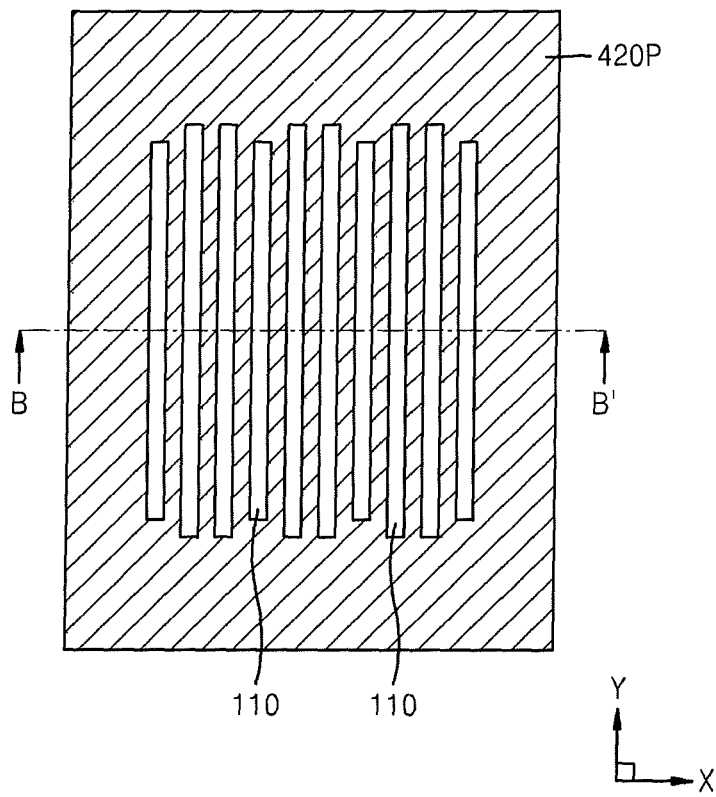
Figure 18B:
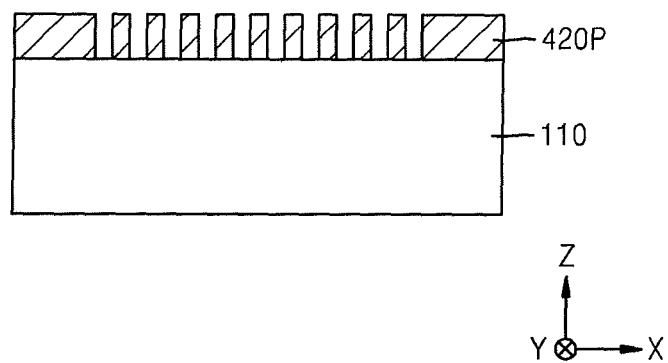

Referring to FIGS. 18A and 18B, unnecessary layers remaining on the hard mask pattern 420P are removed to expose the upper surface of the hard mask pattern 420P.

In some embodiments, the processes of FIGS. 18A and 18B may be omitted.

Figure 19A:
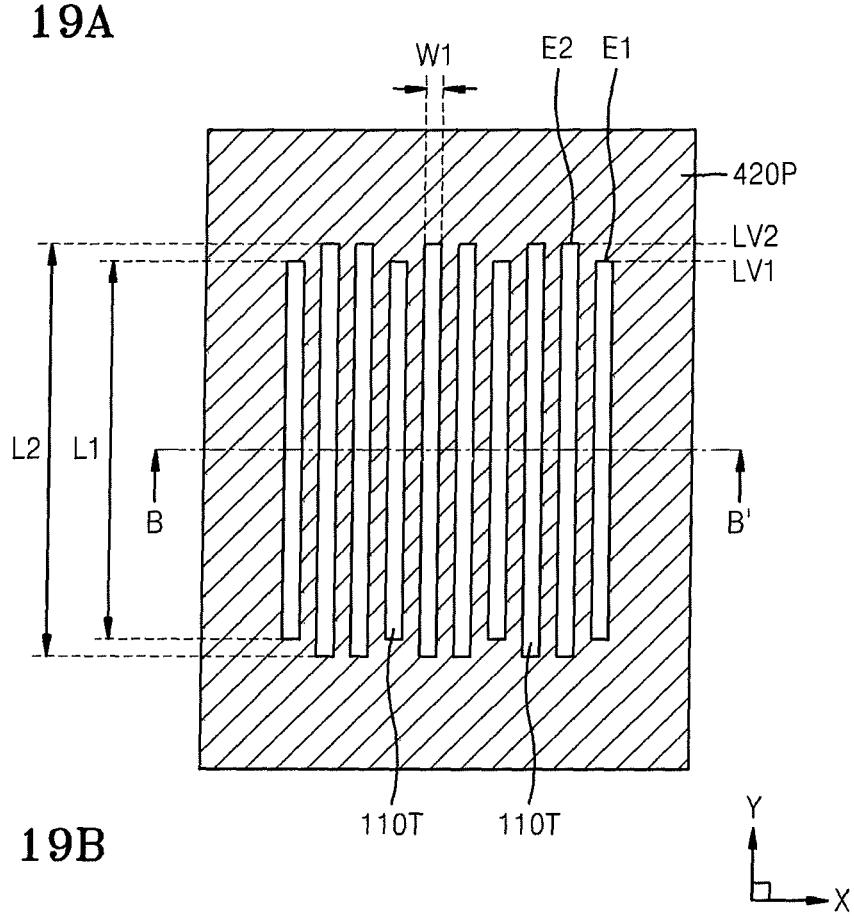
Figure 19B:
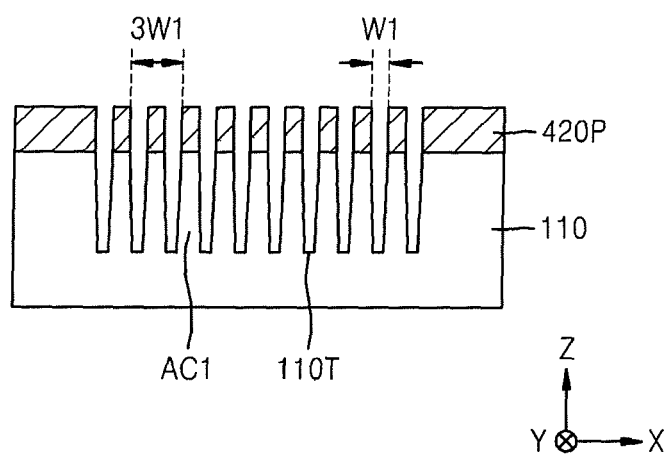

Referring to FIGS. 19A and 19B, the substrate 110 is etched by using the hard mask pattern 420P as an etch mask to thereby form a plurality of isolation trenches 110T that define an active area AC1 in the substrate 110.

The plurality of isolation trenches 110T may have a plurality of line shapes extending parallel to one another in the Y direction at positions that are separate from one another. The plurality of isolation trenches 110T each may have a width W1 that is one third of the third width 3W1 illustrated in FIGS. 12A and 12B.

A length L1 of every third isolation trench 110T according to an arrangement order from among the plurality of isolation trenches 110T is shorter than a length L2 of the other remaining isolation trenches 110T.

A level LV1 of the end point of every third first end portion E1 of the isolation trenches 110T according to an arrangement order of the plurality of isolation trenches 110T is different from a level LV2 of the end point of a second end portion E2 of each of the other isolation trenches 110T, where the first end portion E1 and the second end portion E2 are directed in the same direction.

Figure 20A:
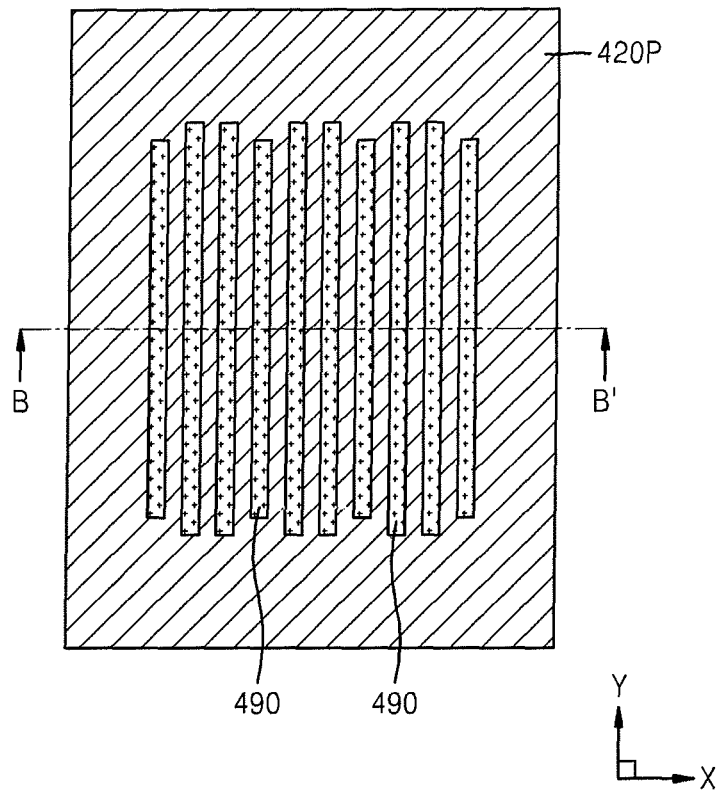
Figure 20B:
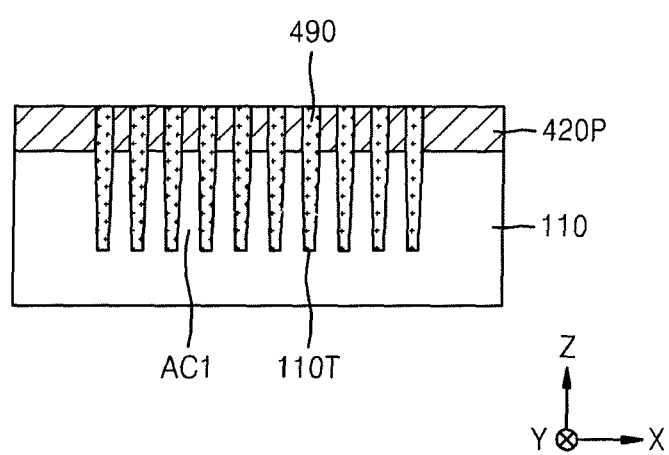

Referring to FIGS. 20A and 20B, after depositing an insulating material in the plurality of isolation trenches 110T and on the hard mask pattern 420P, a resultant structure is planarized by a chemical mechanical polishing (CMP) process until the hard mask pattern 420P is exposed, and thus, a plurality of isolation layers 490 formed of the insulating material are formed in the plurality of isolation trenches 110T.

The active area AC1 is defined in the substrate 110 by the plurality of isolation layers 490.

Figure 21A:
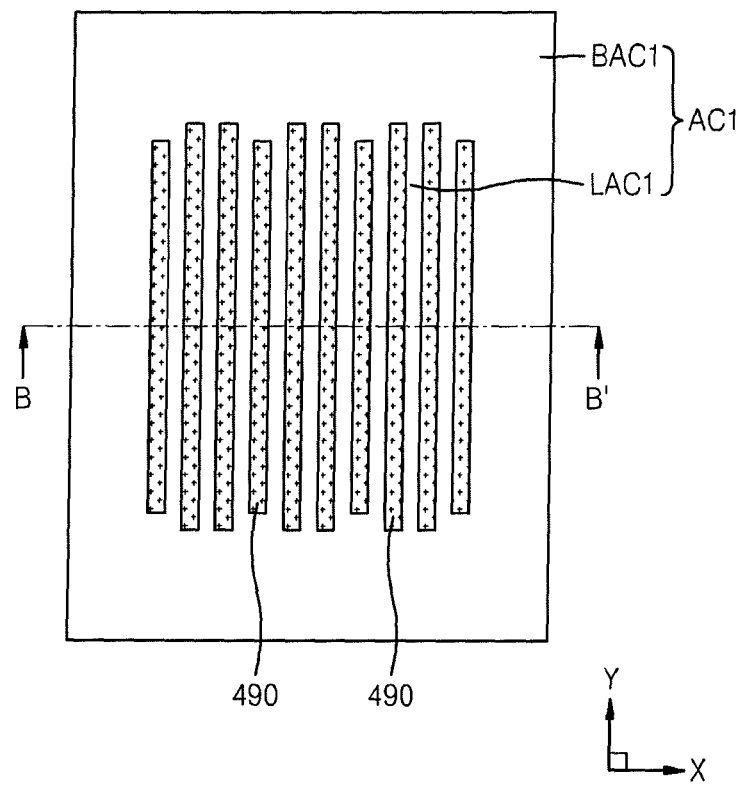
Figure 21B:
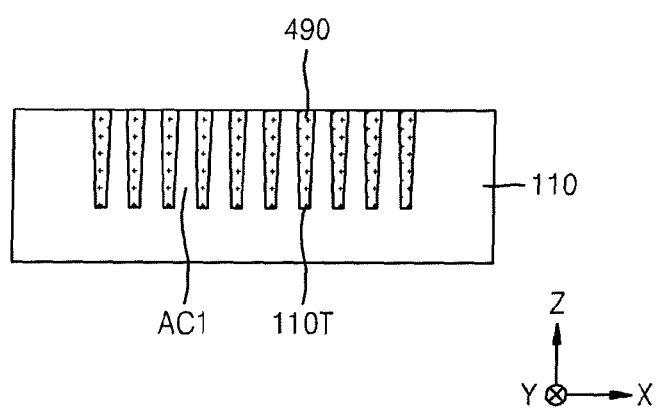

Referring to FIGS. 21A and 21B, the hard mask pattern 420P (refer to FIGS. 20A and 20B) is removed, and an etch-back process is performed on the plurality of isolation layers 490 until the upper surface of the substrate 110 is exposed.

In some embodiments, the processes of FIGS. 21A and 21B may be omitted.

The active area AC1 includes a plurality of line active areas LAC1 that extend parallel to one another along the Y direction and are separate from one another, and a bridge active area BAC1 that extends in the X direction so that at least some of the plurality of line active areas LAC1 are connected to each other at end portions thereof. The plurality of line active areas LAC1 and the bridge active area BAC1 are connected to each other in a body.

FIGS. 22A to 29B are views for explaining a method of manufacturing a semiconductor device, according to exemplary embodiments. FIGS. 22A to 29A are plan views illustrating intermediate process steps in a method of manufacturing a semiconductor device and FIGS. 22B to 29B are cross-sectional views taken along line B-B' of FIGS. 22A to 29A, respectively.

Another exemplary process of defining an active area in a substrate 110 is described with reference to FIGS. 22A to 29B. In FIGS. 22A to 29B, the same reference numerals as FIGS. 1A to 21B denote the same elements as FIGS. 1A to 21B. Thus, repeated descriptions thereof will not be given.

Figure 22A:
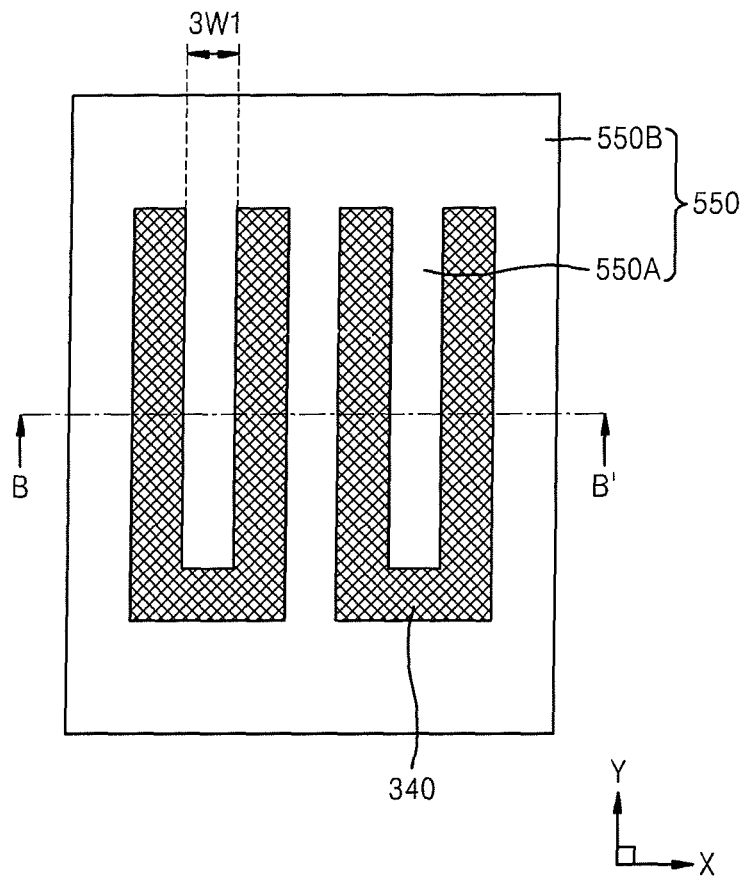
FIGS. 22A to 29B illustrate views of a method of manufacturing a semiconductor device according to exemplary embodiments.
Figure 22B:
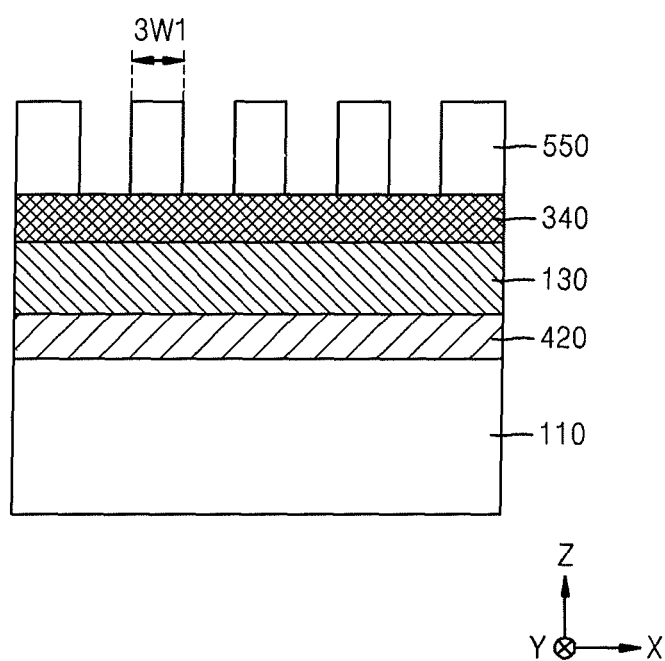

Referring to FIGS. 22A and 22B, as described with reference to FIGS. 12A and 12B, a hard mask layer 420, a polymer-containing layer 130, and a capping layer 340 are sequentially formed on a substrate 110, and a mask pattern 550 is formed on the capping layer 340.

The mask pattern 550 has substantially the same structure as the mask pattern 450 illustrated in FIGS. 12A and 12B except for the planar shape. The mask pattern 550 includes a plurality of first mask portions 550A and a second mask portion 550B having a relatively large width to connect some of the plurality of first mask portions 550A to each other. Some of the plurality of first mask portions 550A may have an end that is separate from the second mask portion 550B.

Figure 23A:
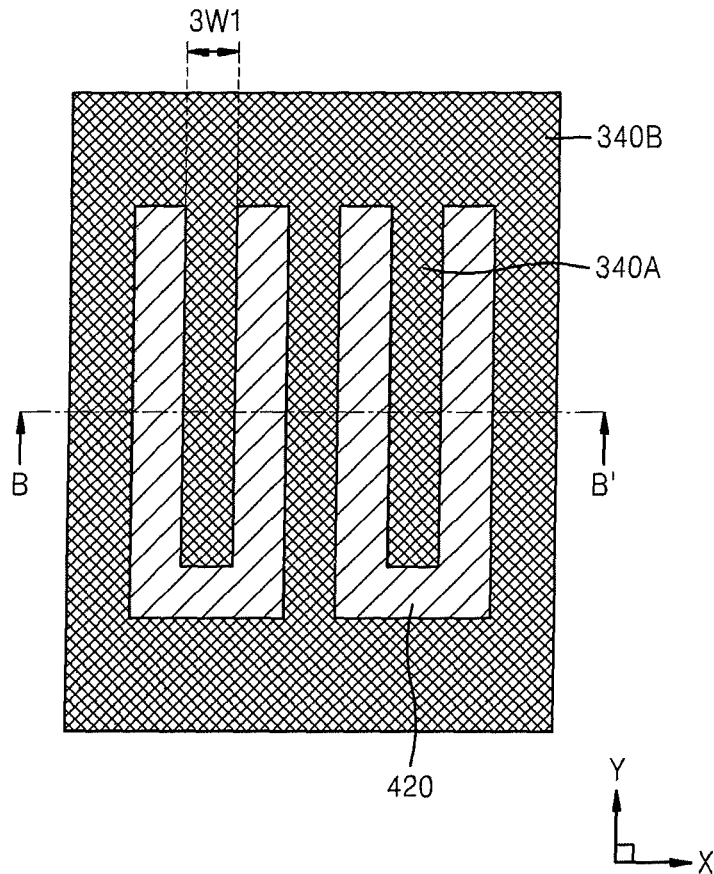
Figure 23B:
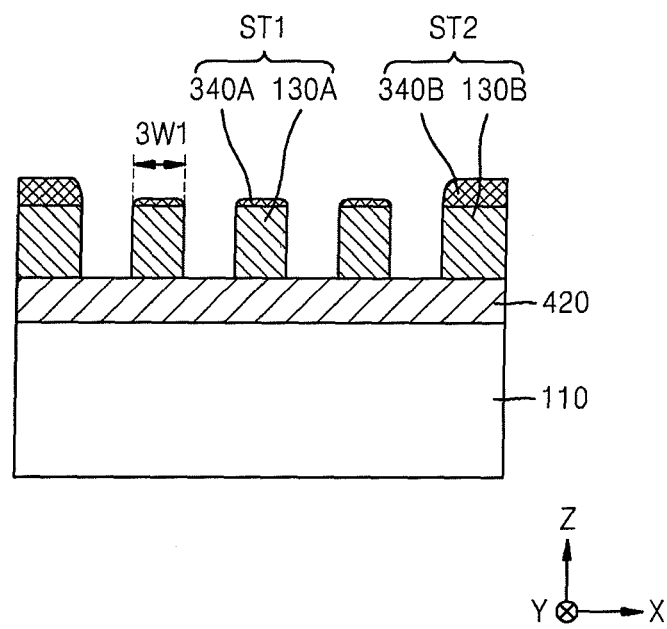

Referring to FIGS. 23A and 23B, a structure in which a first stack structure ST1 and a second stack structure ST2 are connected to each other is formed on the hard mask layer 420 by using the method as described with reference to FIGS. 13A and 13B. The first stack structure ST1 includes a first polymer-containing pattern 130A and a first capping pattern 340A. The second stack structure ST2 includes a second polymer-containing pattern 130B and a second capping pattern 340B.

Figure 24A:
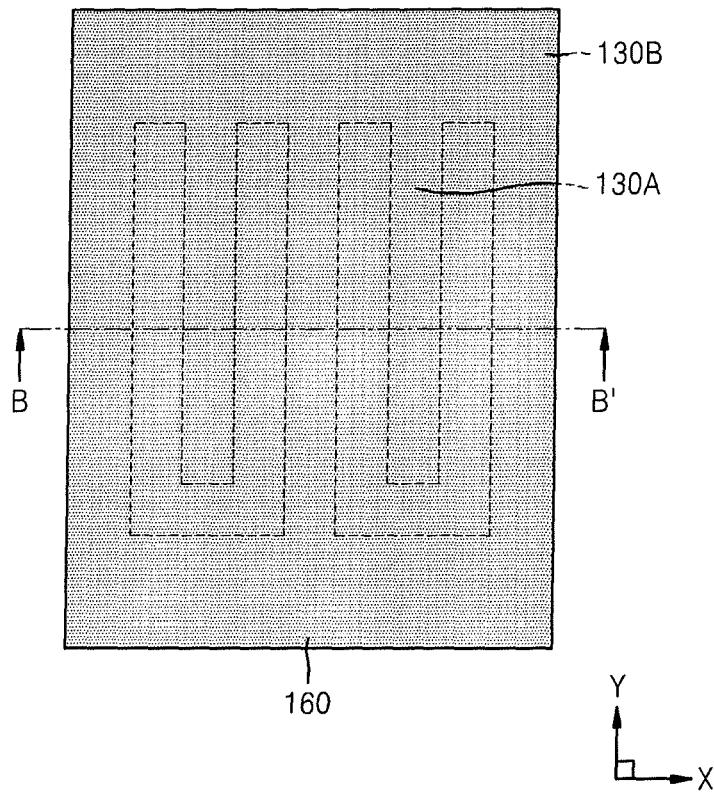
Figure 24B:
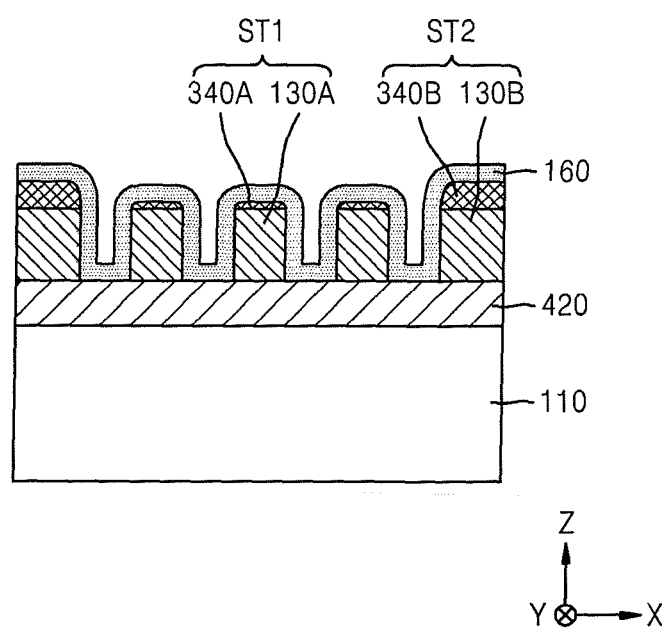

Referring to FIGS. 24A and 24B, a porous layer 160 is formed on a resultant structure with the first and second stack structures ST1 and ST2 by using the method as described with reference to FIGS. 14A and 14B.

Figure 25A:
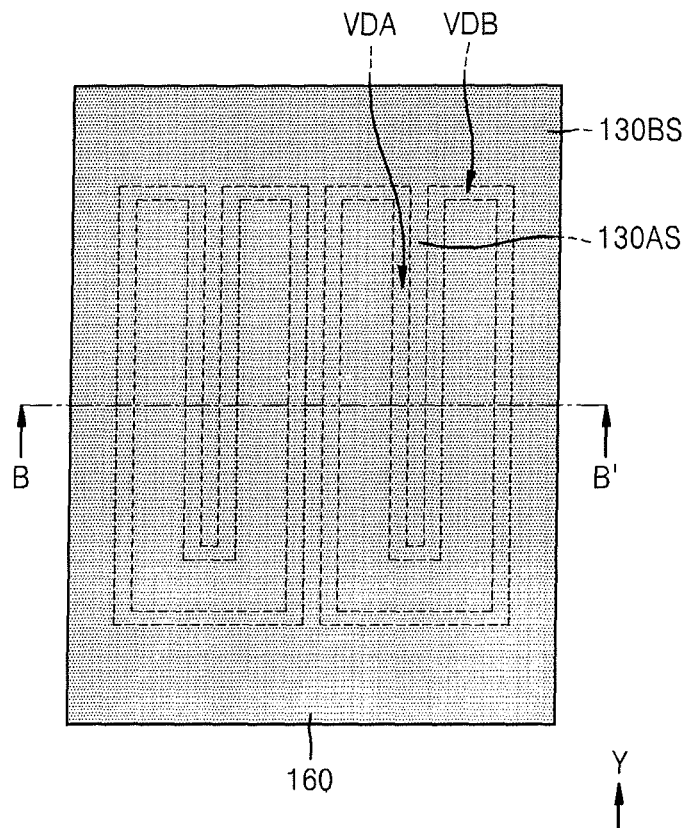
Figure 25B:
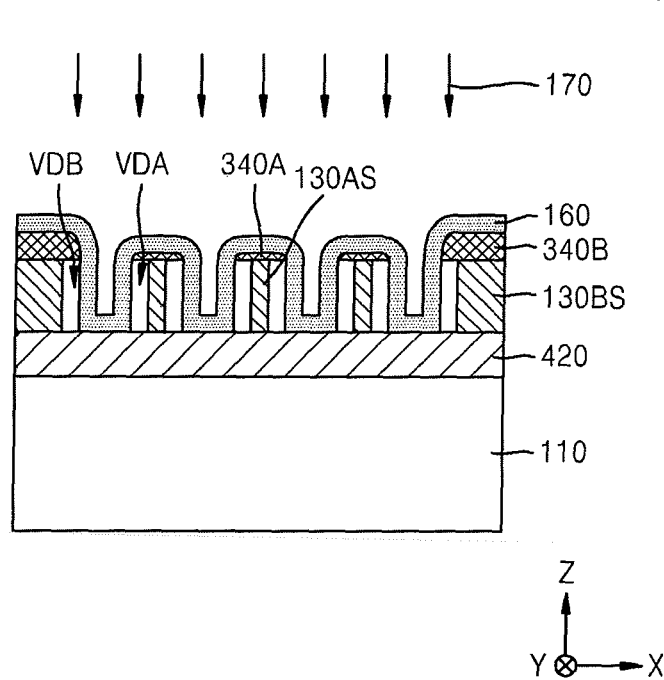

Referring to FIGS. 25A and 25B, a reduced first polymer-containing pattern 130AS and a reduced second polymer-containing pattern 130BS are formed by using a decomposition gas 170 of the method as described with reference to FIGS. 15A and 15B. Thus, a first void VDA is formed between the reduced first polymer-containing pattern 130AS and the porous layer 160, and a second void VDB is formed between the reduced second polymer-containing pattern 130BS and the porous layer 160.

Figure 26A:
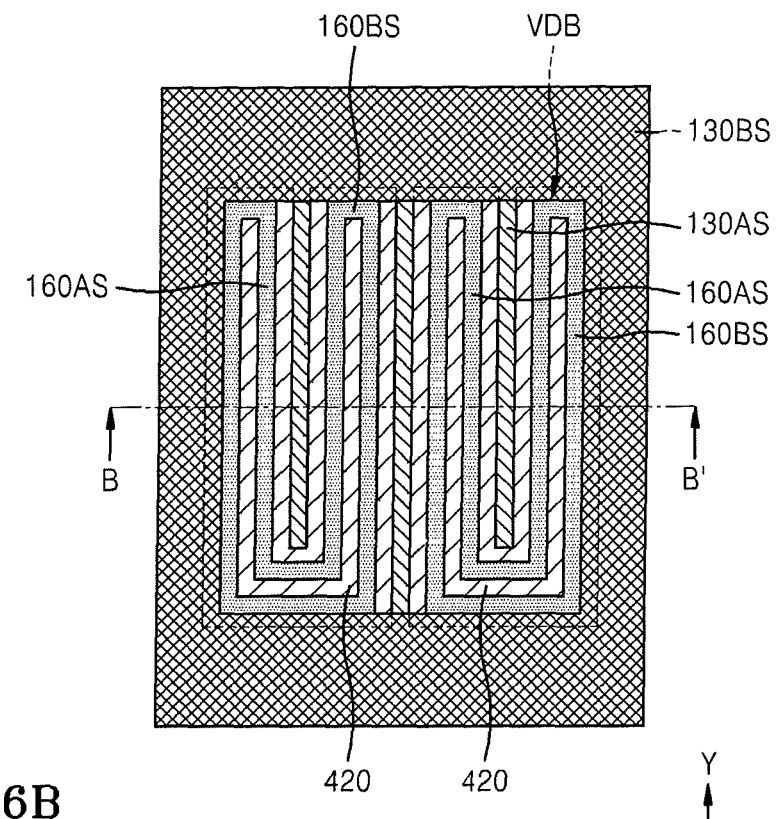
Figure 26B:
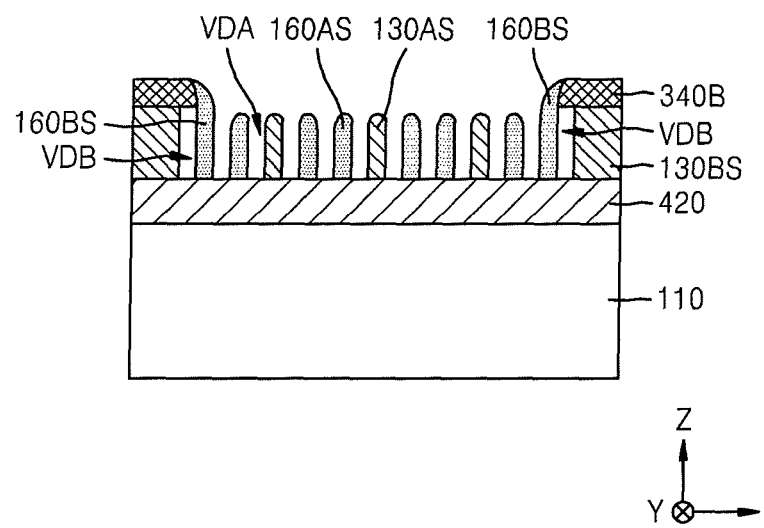

Referring to FIGS. 26A and 26B, a portion of the porous layer 160 is removed by using the method as described with reference to FIGS. 16A and 16B, and thus, a first porous spacer pattern 160AS, which is spaced apart from the reduced first polymer-containing pattern 130AS, and a second porous spacer pattern 160BS, which is spaced apart from the reduced second polymer-containing pattern 130BS, are formed.

Figure 27A:
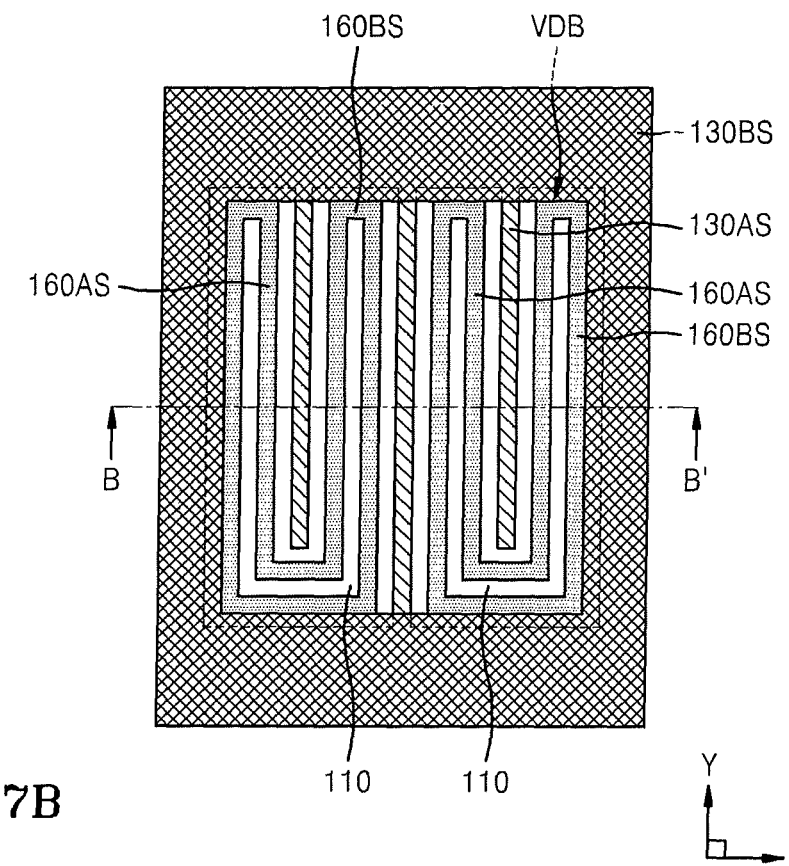
Figure 27B:
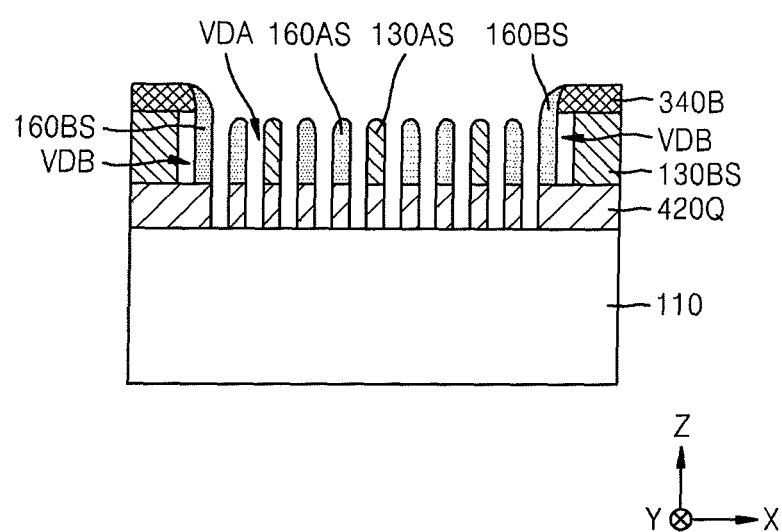

Referring to FIGS. 27A and 27B, the hard mask layer 420 is etched by using the reduced first polymer-containing pattern 130AS, the first porous spacer pattern 160AS, a remaining portion of the second capping pattern 340B, and the second porous spacer pattern 160BS as an etch mask, similar to the method described with reference to FIGS. 17A and 17B, and thus, a hard mask pattern 420Q is formed.

Figure 28A:
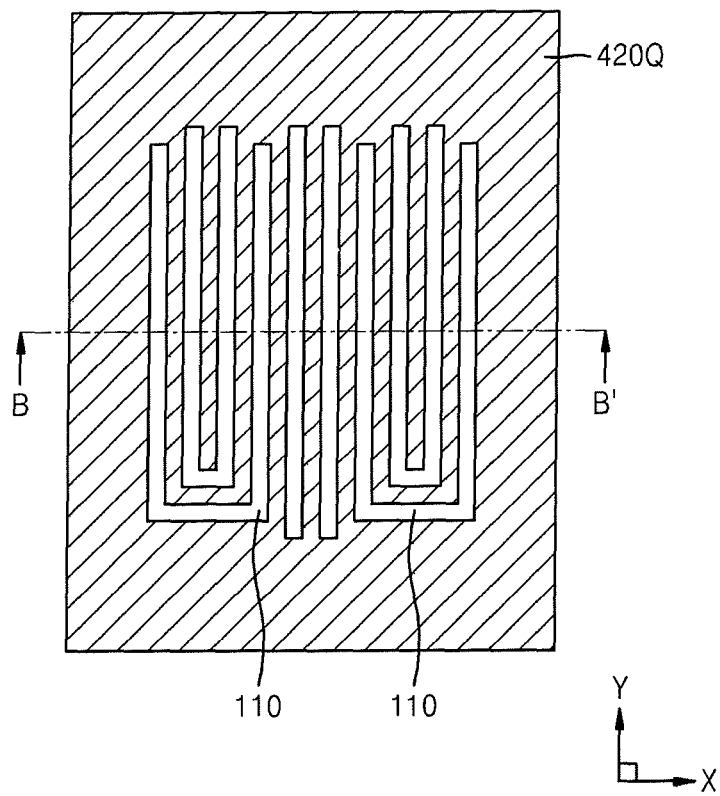
Figure 28B:
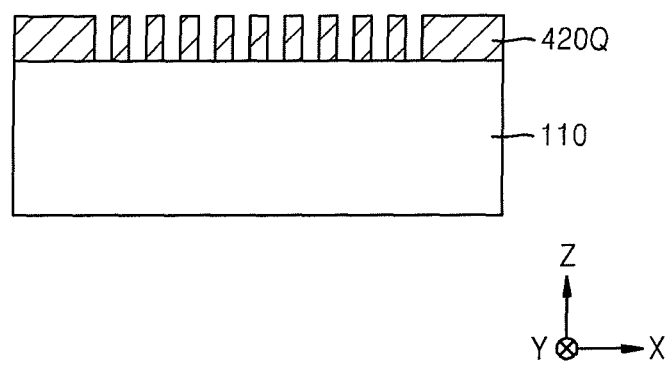

Referring to FIGS. 28A and 28B, unnecessary layers remaining on the hard mask pattern 420Q are removed by using a method that is similar to that described with reference to FIGS. 18A and 18B to expose the upper surface of the hard mask pattern 420Q.

In some embodiments, the processes of FIGS. 28A and 28B may be omitted.

Figure 29A:
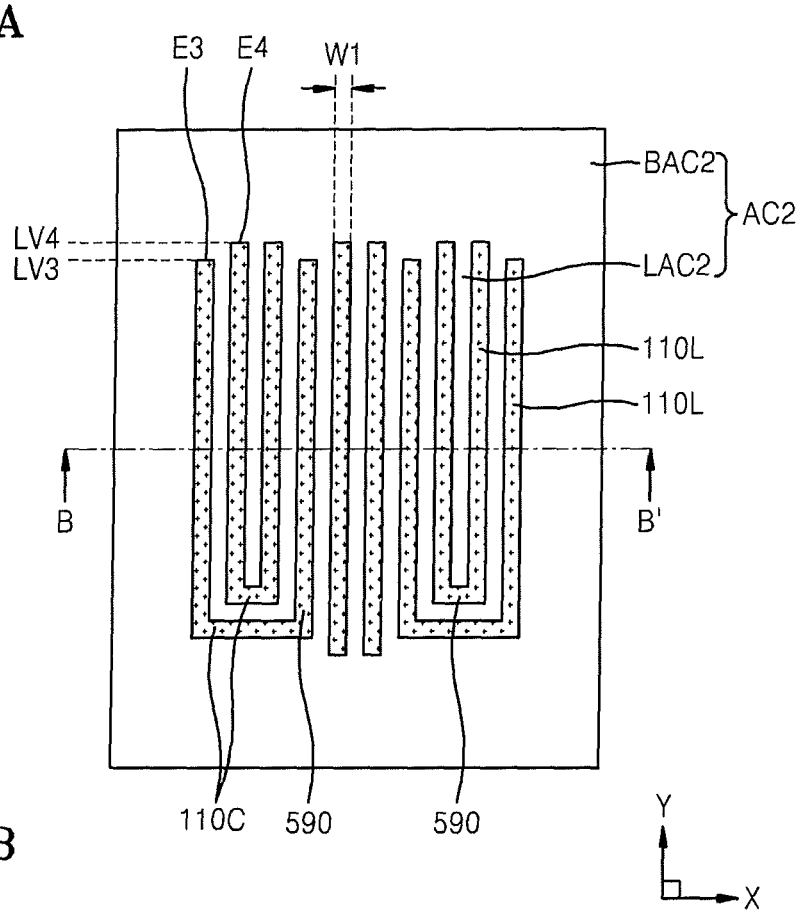
Figure 29B:
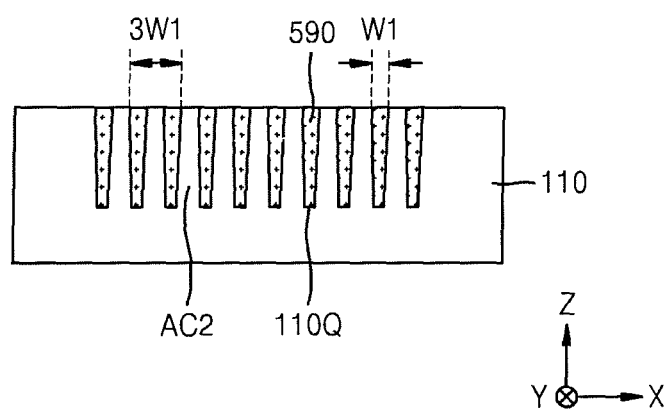

Referring to FIGS. 29A and 29B, the substrate 110 is etched by using the hard mask pattern 420Q (refer to FIGS. 28A and 28B) as an etch mask, similar to the method described with reference to FIGS. 19A to 20B, to thereby form a plurality of isolation trenches 110Q that define an active area AC2 in the substrate 110. A plurality of isolation layers 590 are formed in the plurality of isolation trenches 110Q.

The active area AC2 is defined in the substrate 110 by the plurality of isolation layers 590.

The plurality of isolation trenches 110Q include a plurality of line trench portions 110L extending parallel to one another in the Y direction at positions that are separate from one another. The plurality of line trench portions 110L each may have a width W1 that is one third of the third width 3W1 illustrated in FIGS. 22A and 22B.

A level LV3 of the end point of a third end portion E3 of every third line trench portion 110L according to an arrangement order of the plurality of line trench portions 110L is different from a level LV4 of the end point of a fourth end portion E4 of each of the other line trench portions 110L, where the third end portion E3 and the fourth end portion E4 are directed in the same direction.

The plurality of isolation trenches 110Q may further include a connection trench portion 110C extending in the X direction so that at least two selected from the plurality of line trench portions 110L may be connected to each other.

The active area AC2 includes a plurality of line active areas LAC2 that extend parallel to one another in the Y direction and are separate from each other, and a bridge active area BAC2 that extends in the X direction so that at least some of the plurality of line active areas LAC2 are connected to each other at end portions thereof. The plurality of line active areas LAC2 and the bridge active area BAC2 are connected to each other in a body.

The active area AC1 formed by the method described with reference to FIGS. 12A to 21B and the active area AC2 formed by the method described with reference to FIGS. 22A to 29B may be appropriately adopted as an active area of a semiconductor device performing various functions.

Figure 30:
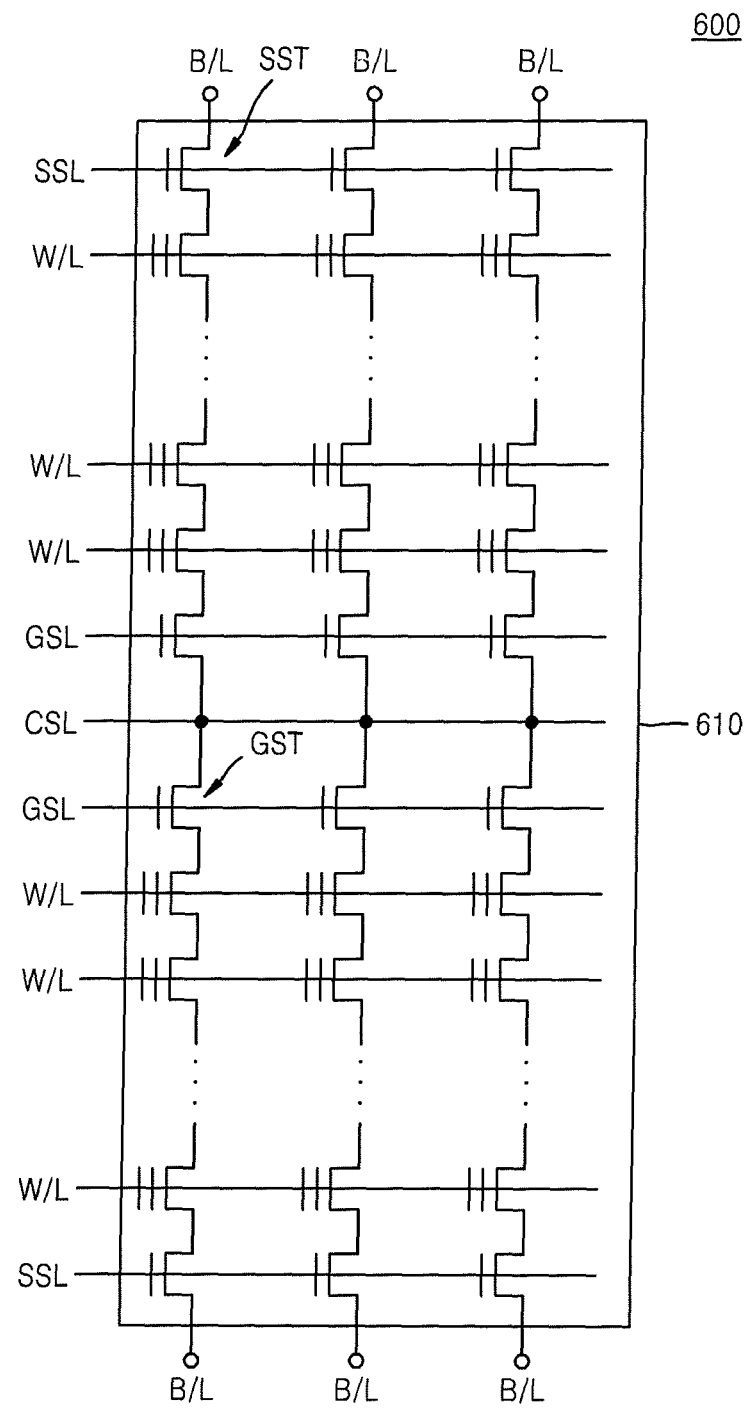
FIG. 30 is an exemplary circuit diagram of a memory cell array of a flash memory device that may be implemented by a method of manufacturing a semiconductor device according to exemplary embodiments.

FIG. 30 is an exemplary circuit diagram of a memory cell array 610 of a flash memory device 600 that may be implemented by the semiconductor device manufacturing method according to exemplary embodiments.

Referring to FIG. 30, the memory cell array 610 includes a plurality of cell strings. Each of the plurality of cell strings includes a plurality of memory cells connected between a bit line B/L and a common source line CSL. Each of the plurality of cell strings includes a string select transistor (SST) connected to a string select line (SSL), the plurality of memory cells connected to a plurality of word lines W/L, and a ground select transistor (GST) connected to a ground select line (GSL). The string select transistor SST is connected to the bit line B/L, and the ground select transistor GST is connected to the common source line CSL.

Figure 31:
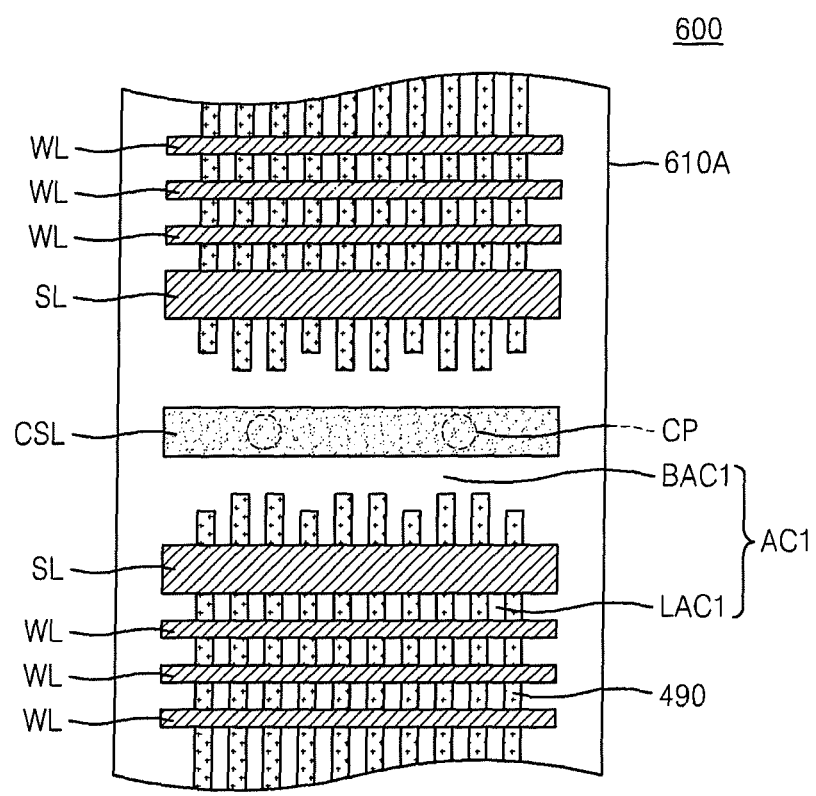
FIG. 31 is a plan view illustrating a configuration of a cell array area of a flash memory device formed by a method of manufacturing a semiconductor device according to exemplary embodiments.

FIG. 31 is a plan view illustrating a configuration of a cell array area 610A in which the memory cell array 610 of the flash memory device 600 illustrated in FIG. 30 is formed.

The cell array area 610A includes a resultant structure formed by the semiconductor memory device manufacturing method according to one of the above embodiments of the inventive concepts. In FIG. 31, the same reference numerals as FIGS. 1A to 29B denote the same elements as FIGS. 1A to 29B.

Referring to FIG. 31, in the cell array area 610A, a gate dielectric layer and a conductive layer for word lines are sequentially formed on a substrate 110 in which an active area AC1 is defined, by using the method described with reference to FIGS. 12A to 21B. The conductive layer for word lines and the gate dielectric layer are patterned to thereby form a plurality of word lines WL and a select line SL, which extend in the X direction to intersect a plurality of line active areas LAC1, on the plurality of line active areas LAC1. The select line SL may form the ground select line GSL illustrated in FIG. 30. However, the inventive concepts are not limited thereto.

In addition, a common source line CSL extending in the X direction is formed on a bridge active area BAC1 to overlap with the bridge active area BAC1.

In some embodiments, the common source line CSL may be formed after the plurality of word lines WL and the select line SL are first formed. For example, the plurality of word lines WL and the select line SL are formed, and an interlayer insulating layer (not shown), which covers the plurality of word lines WL and the select line SL, is formed. Next, after exposing a portion of the bridge active area BAC1 by removing a portion of the interlayer insulating layer, the common source line CSL that is connected to the bridge active area BAC1 may be formed. For example, the common source line CSL may be connected to the bridge active area BAC1 via a contact plug CP. In another example, the common source line CSL may be directly connected to the bridge active area BAC1 without the contact plug CP.

In the semiconductor device 600 illustrated in FIG. 31, the bridge active area BAC1, to which the common source line CSL is connected, provides a relatively large active area compared to the plurality of line active areas LAC1. Accordingly, a sufficient contact area is obtained between the common source line CSL and the bridge active area BAC1, and thus, a defect due to a misalignment between the common source line CSL and the bridge active area BAC1 may be suppressed. In addition, as the sufficient contact area is obtained between the common source line CSL and the bridge active area BAC1, a metal silicide layer may be stably formed in a part of the bridge active area BAC1 to which the common source line CSL is to be connected. Accordingly, the resistance of the common source line CSL may be advantageously reduced, and signal noises may be reduced, thereby improving the reliability of the flash memory device 600.

In FIG. 31, the plurality of word lines WL, the select line SL, and the common source line CSL are formed on the substrate 110, in which the active area AC1 is defined by the method described with reference to FIGS. 12A to 21B, to thereby form the memory cell array 610 of the flash memory device 600 illustrated in FIG. 30. However, the inventive concepts are not limited thereto. For example, the plurality of word lines WL, the select line SL, and the common source line CSL may be formed by using the method as described with reference to FIG. 31 on the substrate 110, in which the active area AC2 is defined by the method described with reference to FIGS. 22A to 29B, to thereby form the memory cell array 610 of the flash memory device 600 illustrated in FIG. 30.

Figure 32:
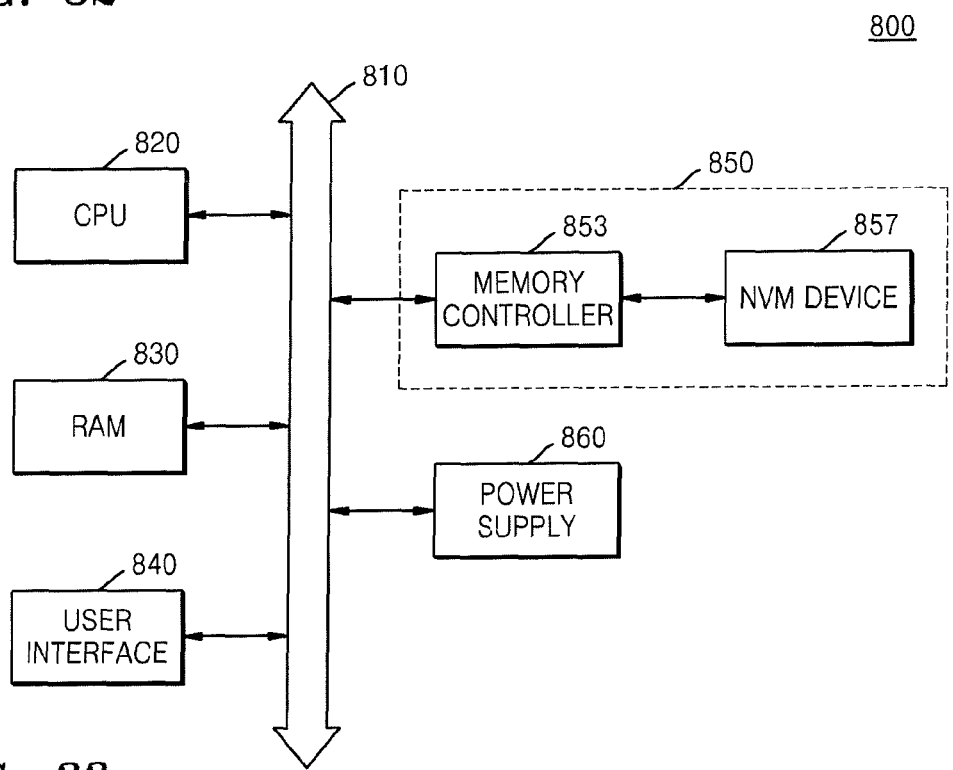
FIG. 32 illustrates a block diagram of a memory system including a semiconductor device obtained by a method of manufacturing a semiconductor device according to exemplary embodiments.

FIG. 32 is a block diagram of a memory system 800 including a semiconductor device obtained by the semiconductor device manufacturing method according to exemplary embodiments.

Referring to FIG. 32, the memory system 800 includes a system bus 810, a central processing unit (CPU) 820, random access memory (RAM) 830, a user interface 840, a nonvolatile memory device 850, and a power supply 860.

The nonvolatile memory device 850 is electrically connected to the memory system 800 via the system bus 810. The nonvolatile memory device 850 includes a memory controller 853 and a nonvolatile memory device 857. Data, which is provided via the user interface 840 or is processed by the CPU 820, is stored in the nonvolatile memory device 857 via the memory controller 853.

The memory system 800 including a semiconductor device manufactured by the method according to one of the above embodiments of the inventive concepts may further include an application chipset, a camera image processor, and the like.

Figure 33:
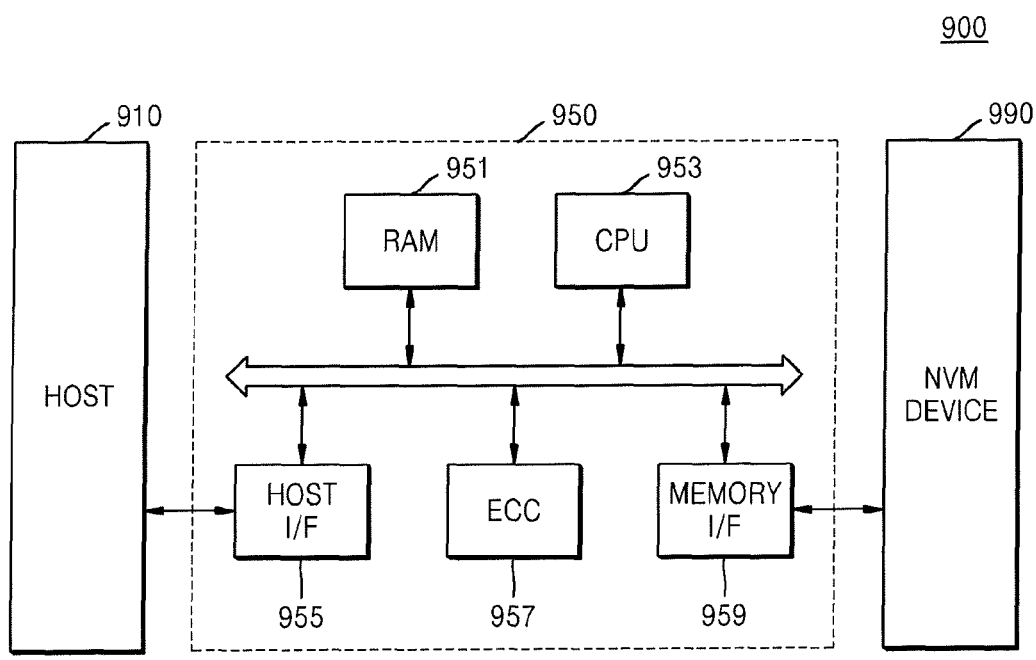
FIG. 33 illustrates a block diagram of another memory system including a semiconductor device obtained by a method of manufacturing a semiconductor device according to exemplary embodiments.

FIG. 33 is a block diagram of another memory system 900 including a semiconductor device obtained by the semiconductor device manufacturing method according to exemplary embodiments.

Referring to FIG. 33, the memory system 900 may include a memory controller 950 and a nonvolatile memory device 990.

The memory controller 950 is connected to a host 910 and the nonvolatile memory device 990. The memory controller 950 is configured to access the nonvolatile memory device 990 in response to a request from the host 910. For example, the memory controller 950 is configured to control read, write, and erase operations of the nonvolatile memory device 990. The memory controller 950 is configured to provide an interface between the nonvolatile memory device 990 and the host 910. The memory controller 950 is configured to drive firmware for controlling the nonvolatile memory device 990.

The memory controller 950 may include elements, such as RAM 951, a CPU 953, a host interface 955, an error correction code (ECC) block 957, and a memory interface 959. The RAM 951 may be used as a working memory of the CPU 953. The CPU 953 may control the entire operation of the memory controller 950.

The host interface 955 may include a protocol for performing data exchange between the host 910 and the memory controller 950. For example, the memory controller 950 may be configured to communicate with the outside, for example, the host 910, by using one of various interface protocols, such as an universal serial bus (USB) protocol, a multimedia card (MMC) protocol, a peripheral component interconnection (PCI) protocol, a PCI-express (PCI-E) protocol, an advanced technology attachment (ATA) protocol, a serial ATA (SATA) protocol, a small computer small interface (SCSI) protocol, an enhanced small disk interface (ESDI) protocol, and an integrated drive electronics (IDE) protocol.

The ECC block 957 may be configured to detect an error of data read from the nonvolatile memory device 990 and correct the detected error. The ECC block 957 may be provided as an element of the memory controller 950. As another example, the ECC block 957 may be provided as an element of the nonvolatile memory device 990. The memory interface 959 may be interfaced with the nonvolatile memory device 990. The memory system 900 may further include read only memory (ROM) that stores code data for interfacing with the host 910.

The memory controller 950 and the nonvolatile memory device 990 may be integrated in a single semiconductor device to form a memory card. For example, the memory controller 950 and the nonvolatile memory device 990 may be integrated in a single semiconductor device to form a personal computer memory card international association (PCMCIA) card, a compact flash (CF) card, a smart media (SM) card, a memory stick, a multi media card (MMC), a secure digital (SD) card, or an universal flash storage (UFS).

As another example, the memory system 900 may be applied to at least one selected from a solid state drive (SSD), a computer, a portable computer, an ultra mobile personal computer (UMPC), a work station, a net book, a personal digital assistant (PDA), a web tablet, a wireless phone, a mobile phone, a digital camera, a digital audio recorder, a digital audio player, a digital video recorder, a digital video player, a device for wirelessly receiving and transmitting information, various electronic devices forming a home network, various electronic devices forming a computer network, various electronic devices forming a telematics network, various electronic devices forming a computer system, a radio frequency identification (RFID) device, and an embedded system.

As another example, the nonvolatile memory device 990 or the memory system 900 may be embedded using various types of packages. For example, the nonvolatile memory device 990 or the memory system 900 may be embedded using packages, such as a package on package (POP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), system in package (SIP), multi chip package (MCP), wafer-level fabricated package (WFP), and wafer-level processed stack package (WSP).

While the inventive concepts have been particularly shown and described with reference to exemplary embodiments thereof, it will be understood that various changes in form and details may be made therein without departing from the spirit and scope of the following claims.

What is claimed is:

1. A method of manufacturing a semiconductor device, the method comprising:
    forming a polymer-containing pattern on a layer to be etched;
    forming a porous layer covering an exposed surface of the polymer-containing pattern on the layer to be etched;
    supplying a decomposition gas to the polymer-containing pattern through the porous layer and decomposing at least a portion of the polymer-containing pattern to form a reduced polymer-containing pattern and to form a void between the reduced polymer-containing pattern and the porous layer;

removing at least a portion of the porous layer to form a porous spacer pattern spaced apart from the reduced polymer-containing pattern; and etching the layer to be etched by using the reduced polymer-containing pattern and the porous spacer pattern as an etch mask.

2. The method of claim 1, wherein in the forming of the porous layer, the porous layer is formed to conformally cover an exposed surface of the layer to be etched and sidewalls and an upper surface of the polymer-containing pattern.

3. The method of claim 2, wherein in the forming of the reduced polymer-containing pattern and the void, a portion of the polymer-containing pattern is decomposed from the sidewalls of the polymer-containing pattern by the decomposition gas to reduce a width of the polymer-containing pattern, and the void is formed to have a ring shape around the reduced polymer-containing pattern in a space surrounded by the porous layer.

4. The method of claim 2, wherein in the forming of the reduced polymer-containing pattern and the void, a portion of the polymer-containing pattern is decomposed from the sidewalls of and the upper surface of the polymer-containing pattern by the decomposition gas to reduce a width and a height of the polymer-containing pattern, and the void is formed to have an inverted-U shaped-cross section around the reduced polymer-containing pattern in a space surrounded by the porous layer.

5. The method of claim 2, wherein the porous spacer pattern comprises a pair of tripling portions spaced apart from and facing both sidewalls of the reduced polymer-containing pattern, respectively.

6. The method of claim 1, wherein the forming of the polymer-containing pattern comprises:

forming a polymer-containing layer on the layer to be etched;

forming a capping layer on the polymer-containing layer; and patterning the capping layer and the polymer-containing layer to thereby form the polymer-containing pattern and a capping pattern covering the upper surface of the polymer-containing pattern, wherein the capping pattern is interposed between the polymer-containing pattern and the porous layer after the porous layer is formed.

7. The method of claim 1, wherein the layer to be etched comprises a substrate, wherein the etching of the layer to be etched comprises defining an active area in the substrate by forming an isolation trench in the substrate.

8. The method of claim 7, wherein the defining of the active area comprises etching the substrate to form the isolation trench comprising a plurality of line trench portions, the plurality of line trench portions extending parallel to one another in a first direction and spaced apart from one another, wherein a length of every third line trench portion according to an arrangement order from among the plurality of line trench portions is shorter than a length of the other line trench portions.

9. The method of claim 7, wherein the defining of the active area comprises etching the substrate to form the isolation trench comprising a plurality of line trench portions, the plurality of line trench portions extending parallel to one another in a first direction and spaced apart from one another, wherein a level of an end point of a first end portion of every third line trench portion according to an arrangement order of the plurality of line trench portions is different from a level of an end point of a second end portion of each of the other line trench portions, the first and second end portions being directed in the same direction.

10. The method of claim 7, wherein the defining of the active area comprises defining a plurality of line active areas extending parallel to one another and being spaced apart from one another, and defining a bridge active area extending in the first direction so that at least some of the plurality of line active areas are connected to each other at end portions thereof.

11. The method of claim 10, further comprising:

forming a plurality of word lines extending to intersect the plurality of line active areas on the plurality of line active areas; and forming a common source line extending in the second direction on the bridge active area and overlapping the bridge active area.

12. A method of manufacturing a semiconductor device, the method comprising:

forming a feature layer on a substrate having a first area and a second area;

forming a stack structure, in which a polymer-containing pattern and a capping pattern which have different widths in the first area and the second area are stacked, on the feature layer;

forming a porous layer covering the stack structure in the first area and the second area;

supplying a decomposition gas to the polymer-containing pattern through the porous layer and decomposing portions of the polymer-containing pattern to form reduced polymer-containing patterns and to form voids between the reduced polymer-containing patterns and the porous layer;

removing portions of the porous layer in the first area and the second area to form a porous spacer pattern spaced apart from the reduced polymer-containing pattern;

removing portions of the capping pattern so that the voids in the first area are opened and the voids in the second area are closed down by a remaining portion of the capping pattern; and etching the feature layer by using the reduced polymer-containing patterns and the porous spacer pattern as an etch mask in the first area and etching the feature layer by using the remaining portion of the capping pattern and the porous spacer pattern as an etch mask in the second area, to form a feature pattern having different widths in the first area and the second area.

13. The method of claim 12, further comprising etching the substrate by using the feature pattern as an etch mask to define active areas having different widths in the first area and the second area.

14. The method of claim 12, wherein the forming of the stack structure comprises:

sequentially forming a polymer-containing layer and a capping layer on the feature layer;

patterning the capping layer to form a first capping pattern, which is positioned in the first area and has a first width, and a second capping pattern which is positioned in the second area and has a second width that is larger than the first width; and etching the polymer-containing layer in the first area and the second area by using the first capping pattern and the second capping pattern as an etch mask to form a first polymer-containing pattern having a third width in the first area and a second polymer-containing pattern having a fourth width, which is larger than the third width, in the second area.

15. The method of claim 14, wherein the polymer-containing layer is etched under the condition that the consumption of the first capping pattern is greater than that of the second capping pattern due to a width difference between the first capping pattern and the second capping pattern while etching the polymer-containing layer, and a thickness of the first capping pattern is smaller than that of the second capping pattern after the first polymer-containing pattern and the second polymer-containing pattern are formed.

16. The method of claim 15, wherein in the removing of the portion of the capping pattern, the amount of etching of the capping pattern is adjusted so that the second capping pattern remains on the second polymer-containing pattern so as not to open the voids in the second area and the first capping pattern does not remain on the first polymer-containing pattern in the first area.

17. The method of claim 12, wherein the first area comprises a memory cell area, and the second area comprises a peripheral circuit area or a core area.

18. A method of manufacturing a semiconductor device, the method comprising:
    forming a feature layer on a substrate;
    forming a stack structure, in which a polymer-containing pattern and a capping pattern are stacked, on the feature layer;
    forming a porous layer covering the stack structure;
    decomposing a portion of the polymer-containing pattern by using a decomposition gas passing through the porous layer to form a reduced polymer-containing pattern and form a void between the reduced polymer-containing pattern and the porous layer;
    removing a portion of the porous layer and the capping pattern so that a porous spacer pattern remains in a position spaced apart from the reduced polymer-containing pattern; and
    etching the feature layer by using the reduced polymer-containing pattern and the porous spacer pattern as an etch mask.

19. The method of claim 18, wherein the polymer-containing pattern comprises an organic compound having a carbon content of about 85 wt % to about 99 wt %, the capping pattern comprises a silicon oxynitride layer, the porous layer comprises a silicon oxide layer, and the decomposition gas comprises an oxygen gas.

20. The method of claim 18, wherein in the forming of the reduced polymer-containing pattern and the void, a decomposition speed from a sidewall of the polymer-containing pattern due to the decomposition gas is higher than that from an upper surface of the polymer-containing pattern due to the decomposition gas.

* * * * *